United States Patent [19]
Johnson

[11] Patent Number: 6,133,986
[45] Date of Patent: *Oct. 17, 2000

[54] MICROLENS SCANNER FOR MICROLITHOGRAPHY AND WIDE-FIELD CONFOCAL MICROSCOPY

[76] Inventor: Kenneth C. Johnson, 2502 Robertson Rd., Santa Clara, Calif. 95051

[*] Notice: This patent issued on a continued prosecution application filed under 37 CFR 1.53(d), and is subject to the twenty year patent term provisions of 35 U.S.C. 154(a)(2).

[21] Appl. No.: 08/803,096

[22] Filed: Feb. 20, 1997

Related U.S. Application Data

[60] Provisional application No. 60/012,434, Feb. 28, 1996.

[51] Int. Cl.⁷ ................................................. G03B 27/54
[52] U.S. Cl. ............................... 355/67; 355/43; 355/77
[58] Field of Search .................................. 355/53, 43, 77

[56] References Cited

U.S. PATENT DOCUMENTS

| | | | |
|---|---|---|---|
| 3,013,467 | 12/1961 | Minsky . | |
| 4,101,210 | 7/1978 | Lo et al. | 353/7 |
| 4,289,377 | 9/1981 | Matsui et al. | 350/169 |
| 4,631,581 | 12/1986 | Carlsson . | |
| 4,668,080 | 5/1987 | Gale et al. | 355/51 |
| 5,032,720 | 7/1991 | White . | |
| 5,160,962 | 11/1992 | Miura et al. | 355/53 |
| 5,225,929 | 7/1993 | Ulanowski | 359/389 |
| 5,239,178 | 8/1993 | Derndinger et al. | 250/234 |
| 5,245,369 | 9/1993 | Um et al. | 353/122 |
| 5,260,826 | 11/1993 | Wu | 359/368 |
| 5,418,599 | 5/1995 | Kamon | 27/52 |
| 5,459,578 | 10/1995 | Park et al. . | |
| 5,473,393 | 12/1995 | Manabe | 353/38 |
| 5,495,279 | 2/1996 | Sandstrom | 347/258 |
| 5,517,279 | 5/1996 | Hugle et al. | 355/46 |
| 5,541,679 | 7/1996 | Yang | 353/31 |
| 5,617,181 | 4/1997 | Yanagihara et al. | 355/46 |
| 5,659,420 | 8/1997 | Wakai et al. | 359/368 |
| 5,680,200 | 10/1997 | Sugaya et al. | 355/53 |
| 5,691,541 | 11/1997 | Ceglio et al. | 250/492.1 |
| 5,724,121 | 3/1998 | McKinley et al. | 355/53 |
| 5,737,064 | 4/1998 | Inoue et al. | 355/73 |
| 5,739,899 | 4/1998 | Nishi et al. | 355/53 |

FOREIGN PATENT DOCUMENTS

| | | |
|---|---|---|
| 0 485 803 A1 | 5/1992 | European Pat. Off. . |
| WO 97/05526 | 2/1997 | WIPO . |
| WO 97/43770 | 11/1997 | WIPO . |
| WO 98/04950 | 2/1998 | WIPO . |

OTHER PUBLICATIONS

Tiziani, H.J. et al., "Theoretical analysis of confocal microscopy with microlenses," Applied Optics, vol. 35 (1) ; Jan. 1, 1996, pp. 120–125.

(List continued on next page.)

*Primary Examiner*—Georgia Epps
*Assistant Examiner*—Timothy J. Thompson
*Attorney, Agent, or Firm*—Townsend and Townsend and Crew LLP

[57] ABSTRACT

A microscopy and/or lithography system uses a comparatively low-resolution image projection system, which has a very small numerical aperture but large image field, in conjunction with a microlens array comprising miniature lens elements, each of which has a large numerical aperture but very small field. The projection system contains a small aperture stop which is imaged by the microlenses onto an array of diffraction-limited microspots on the microscope sample or printing surface at the microlens focal point positions, and the surface is scanned to build up a complete raster image from the focal point array. The system design thus circumvents the tradeoff between image resolution and field size which is the source of much of the complexity and expense of conventional wide-field, high-NA microscopy and microlithography systems. The system makes possible flat field, distortion-free imaging, with accurate overlay, focus, and warp compensation, over very large image fields (larger than the practical limits of conventional imaging means). In one embodiment it would use a Digital Micromirror Device as the image source, potentially eliminating the need for photomasks in semiconductor manufacture.

35 Claims, 18 Drawing Sheets

OTHER PUBLICATIONS

Tiziani, Hans J. et al., "Three–dimensional analysis by a microlens–array confocal arrangement," *Applied Optics*, vol. 33 (4) Feb. 1, 1994, pp. 567–572.

Hutley, M.C., in Micro–Optics, Elements, Systems and Applications, (Herzig, Hans Peter, Ed., Taylor & Francis Publishers, Bristol, PA), pp. 140–142, 151–152 (1997).

Seltmann, R. et al., "New System for Fast Submicron Optical Direct Writing," *Microelectronic Engineering* 30 (1996), pp. 123–127.

Smith, Henry I., "A Proposal for Maskless, Zone–Plate–Array Nanolithography," *J. Vac. Sci. Technology*, B14(6), Nov./Dec. 1996, pp. 4318–4322.

Brakenhoff G. J., "Imaging Modes in Confocal Scanning Light Microscopy (CSLM)," *Journal of Microscopy*, Nov. 1979, vol. 117, p:2, pp. 233–242.

Cox I. J. et al., "Scanning Optical Microscope Incorporating a Digital Framestore and Microcomputer," *Applied Optics*, May 15, 1983, vol. 22, No. 10, pp. 1474–1478.

Eisner Martin et al., "Transferring Resist Microlenses Into Silicon by Reactive Ion Etching," *Opt. Eng.*, Oct. 1996, vol. 35, No. 10, pp. 2979–2982.

Gratix Edward J. et al., "Fabrication of Microlenses by Laser Assisted Chemical Etching (LACE)," *SPIE Miniature and Micro–Optics Fabrication and System Applications*, 1991, vol. 1544, pp. 238–243.

Hamilton D. K. et al., "Three Dimensional Surface Measurement Using the Confocal Scanning Microscope," *Applied Physics B*, 1982, B 27, pp. 211–213.

Sampsell Jeffrey Dr., "An Overview of the Performance Envelope of Digital Micromirror Device (DMD) Based Projection Display Systems," *DMD Display*, 1994, Digital Imaging Venture Project, Texas Instrument Incorporated, Dallas, Texas, "Society for Information Displays," pp. 1–4.

Suganuma Hiroshi et al., "Deep UV Lithography Using Continous–Wave 266nm Radiation From All Solid–State Frequency Quadrupled Nd:YAG Laser," *Proceedings of the SPIE—The International Society for Optical Engineering (USA)*, Feb. 22–24, 1995, vol. 2440, pp. 126–135.

Völker Reinhard et al., "Microlens Array Imaging System for Photolithography," *Optictal Engineering*, Nov. 1996, vol. 35, No. 11, pp. 3323–3330.

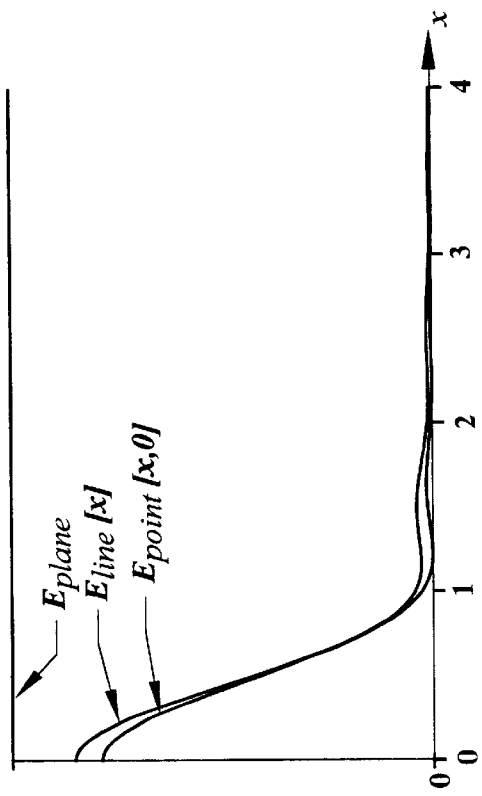
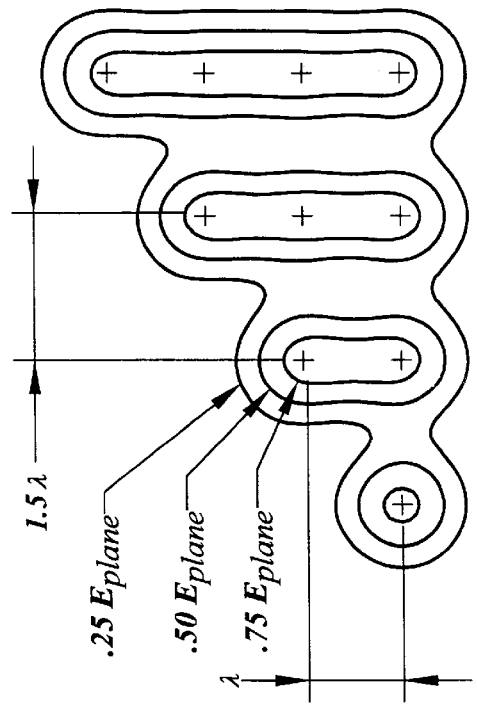
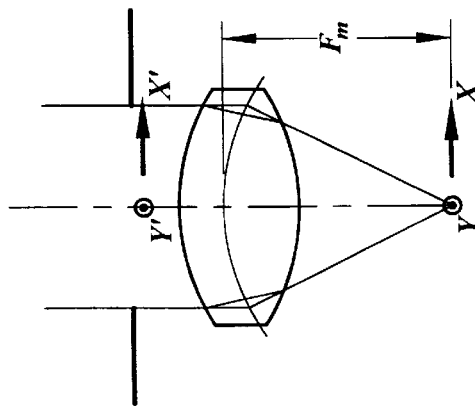
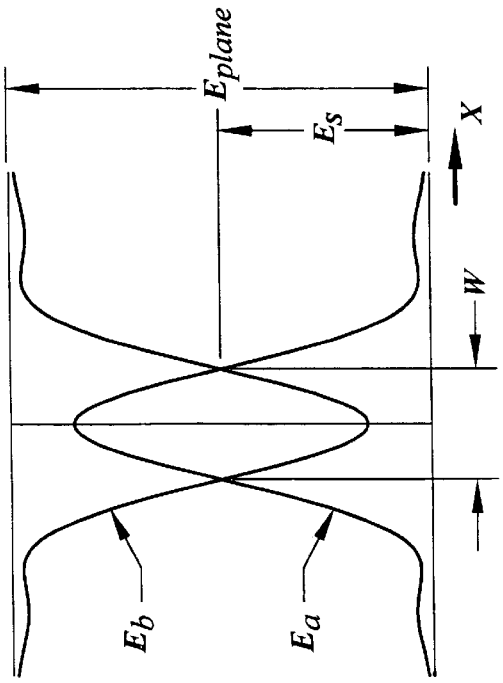
FIG. 7
FIG. 8
FIG. 9
FIG. 10

MICROLENS SCANNER FOR MICROLITHOGRAPHY AND WIDE-FIELD CONFOCAL MICROSCOPY

CROSS-REFERENCE TO RELATED APPLICATION

This application claims priority from provisional application Ser. No. 60/012,434, filed Feb. 28, 1996, the disclosure of which is incorporated by reference.

BACKGROUND OF THE INVENTION

The invention relates to two fields that can be broadly categorized as "image reading" and "image writing." Its primary intended application in the image reading field would be as a tandem scanning confocal microscope, although it could also potentially be used for other applications, for example as a high-resolution document scanner, or as a reader for optical mass storage media, etc. The invention's primary intended application for image writing would be as a microlithography printer for semiconductor manufacture; however this field may also include applications such as document printing, photographic reproduction, etc. The following description will focus on the confocal microscopy and microlithography applications, although the specification can be applied by obvious extension to other applications as well.

A confocal microscope (Ref. 1) is similar to a conventional microscope except that the illumination is filtered by a small pinhole which is focused to a diffraction-limited microspot on the sample, and (in the case of a reflection confocal microscope) the light reflected from the sample is again filtered by the same pinhole. The focused beam is raster-scanned across the sample (by scanning either the pinhole or the sample) to build up a high-resolution raster image of the sample. (A transmission confocal microscope is similar, except that separate pinholes are used to filter the illumination and transmitted light.) In comparison to conventional microscopes a confocal microscope has superior lateral image resolution and also exhibits extremely fine depth resolution.

A tandem scanning confocal microscope of the Nipkow type (see Ref. 1, Chap. 14) uses an array of pinholes, rather than a single pinhole, to achieve a very high image frame rate. The pinholes are formed on a disk which spins at a high rate to provide real-time imaging. A drawback of the Nipkow-type system is that its field size is limited by the performance of conventional microscope objectives. Given the field size limitations of commercial high-power objectives it would take a very long time for a Nipkow-type system to scan, for example, a complete semiconductor wafer, even with its high image frame rate.

In comparison to typical microscopy applications, field size requirements for microlithography steppers are far more demanding. Current steppers must achieve high-resolution, flat-field, and low-distortion imaging performance comparable to high-quality microscope objectives, but over a field size of around 20 mm or greater. This level of performance is attained by using massive, multielement, all-glass projection lenses or catadioptric systems such as the Perkin-Elmer Micralign and Wynne-Dyson systems (Ref. 2, Chap. 8). The optics in such systems must be manufactured to submicron accuracies, and submicron alignment and dimensional stability tolerances must be held over large distances between massive optical and mechanical components to maintain resolution, focus and overlay accuracy. The technical difficulties associated with the combined requirements for high image resolution and large field size pose significant challenges to the further advancement of optical microlithography for semiconductor applications.

SUMMARY OF THE INVENTION

The invention provides imaging systems and techniques that circumvent the tradeoff between image resolution and field size which is the source of much of the complexity and expense of conventional wide-field, high-NA microscopy and microlithography systems.

In short, this is achieved by using a comparatively low-resolution image projection system, which has a very small numerical aperture but large image field, in conjunction with a microlens array comprising miniature lens elements, each of which has a large numerical aperture but very small field. The projection system contains a small aperture stop which is imaged by the microlenses onto an array of diffraction-limited microspots on the microscope sample or printing surface at the microlens focal point positions, and the surface is scanned to build up a complete raster image from the focal point array.

The system's critical dimensional and alignment tolerances are localized in the microlens array itself and in its positioning relative to the sample or printing surface. This minimizes the system's susceptibility to dimensional tolerance stack-up, thermal effects, and weight loading which are problematic in conventional microimaging systems. For the microlithography application, the microlens array can also function as the imaging element of a position encoder which controls the array's alignment relative to the printing surface. By making the exposure imaging optic and the position encoder optic one and the same, dimensional tolerance stack-up in the positioning servomechanism is kept to a minimum. The microlens positioning servo could accurately and precisely control X-Y positioning, focus, and tilt; and in one embodiment it could also compensate for warp in either the printing surface or the lens array itself.

A further understanding of the nature and advantages of the present invention may be realized by reference to the remaining portions of the specification and the drawings.

BRIEF DESCRIPTION OF THE DRAWINGS

FIG. 7 illustrates a microlens's focal plane field coordinates (X, Y) and aperture plane coordinates (X', Y');

FIG. 8 illustrates the microlens point, line, and plane exposure profiles;

FIG. 9 illustrates the exposure profile (E vs X) for an image feature and its complement;

FIG. 10 illustrates constant-exposure contours for several positive line images;

DESCRIPTION OF SPECIFIC EMBODIMENTS
Basic Principles of Operation

Figure 1:
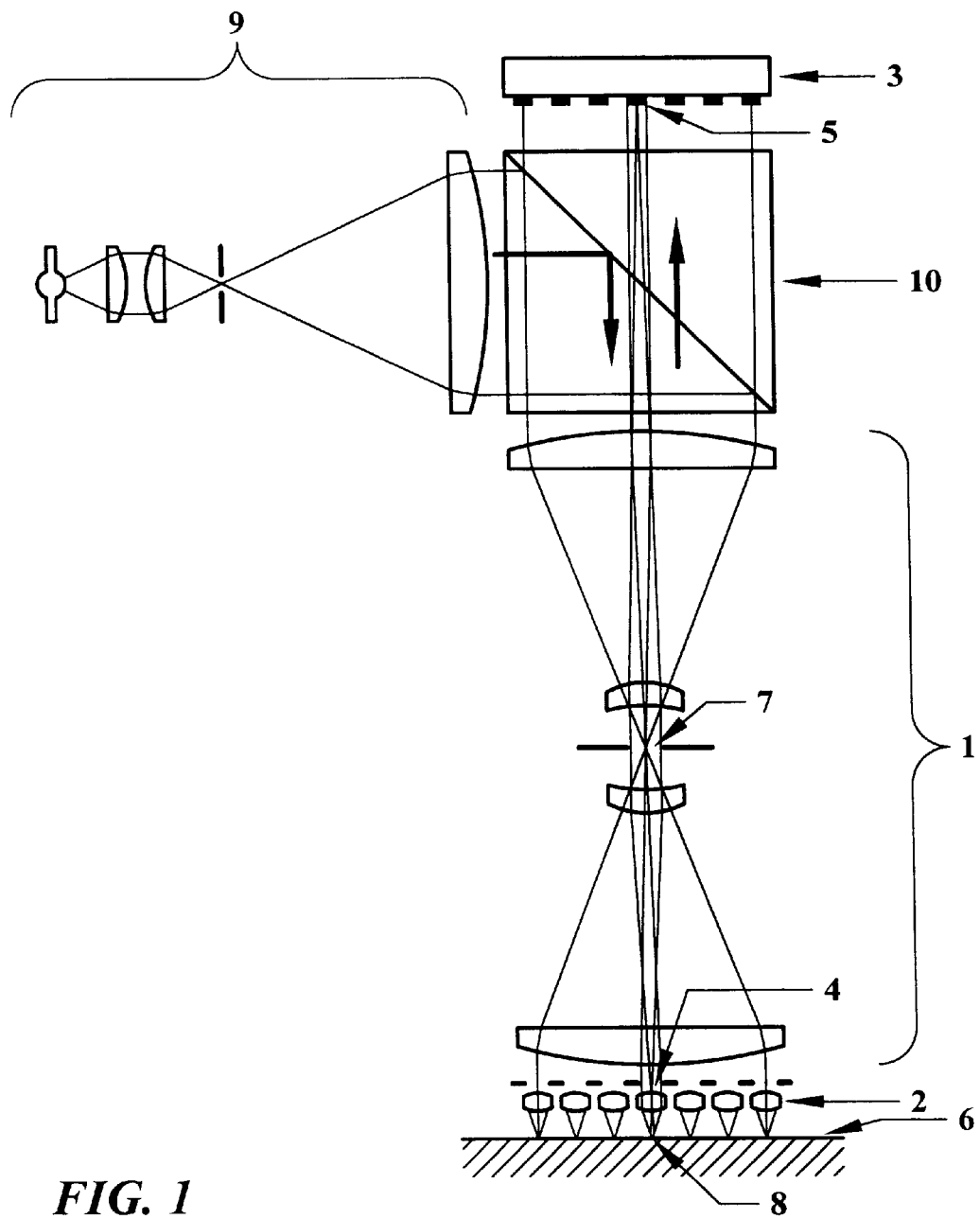
FIG. 1 illustrates a simple embodiment of the invention which could operate as a tandem scanning confocal microscope.

FIG. 1 illustrates a simple embodiment of the invention which could operate as a tandem scanning confocal microscope. The system contains a low-resolution, double-telecentric optical projection system 1 which images a microlens array 2 onto an optical detector array 3, with each microlens element being imaged onto a corresponding light-sensing detector element (e.g., microlens 4 is imaged onto detector element 5). Each individual microlens images a corresponding focal point at or near the sample surface 6 onto the projection system's aperture stop 7, so the corresponding detector element senses the sample reflectivity over a small microspot at the microlens's focal point (e.g., microlens 4 images point 8 onto the projection aperture 7, so element 5 senses the reflectivity at point 8). The sample is illuminate in reflection mode from an illumination system 9. The microspots are selectively illuminated by passing the illumination through the projection aperture 7 and microlens array 2, using a beam splitter 10 to merge the illumination into the light path.

The diffraction-limited images of the projection aperture through the microlenses define the microspots, which are at least an order of magnitude smaller than the microlens aperture dimension. The microspots would preferably be comparable in size to the microlenses' diffraction point spread function. Thus, in the preferred embodiments the projection aperture performs the same function as the pinhole in a confocal microscope. One difference between this system and prior-art tandem scanning confocal microscopes is that instead of imaging an array of pinholes through a single objective, the system uses a single "pinhole" (i.e., the projection aperture) which is imaged through an array of "objectives" (microlenses).

Figure 2:
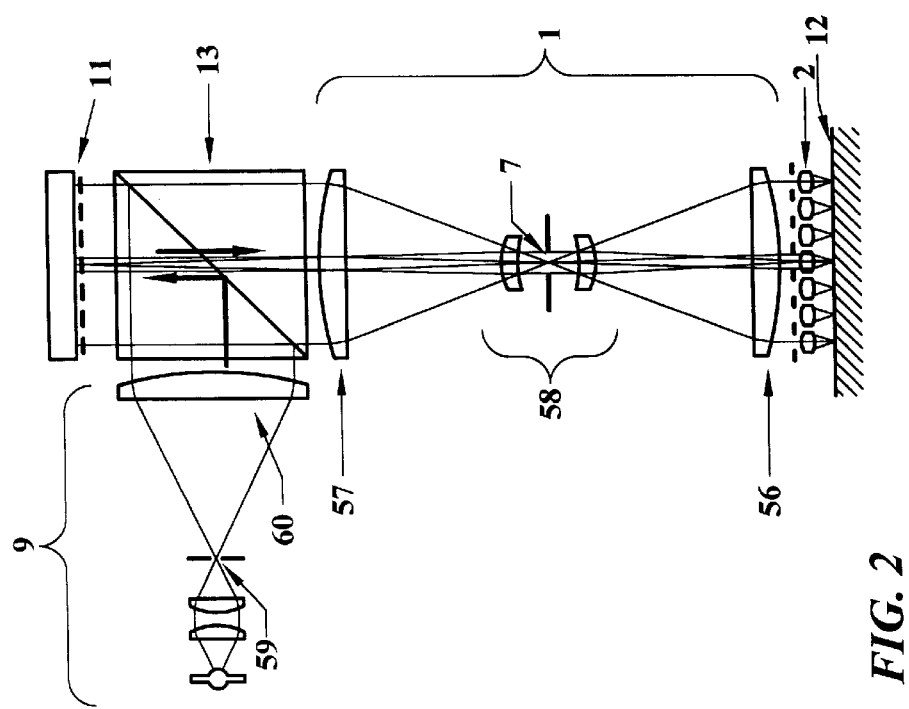
FIG. 2 illustrates a very similar embodiment which could function as a lithography printer.

FIG. 2 illustrates an embodiment which is very similar to the microscopy system of FIG. 1, but which could function as a lithography printer. (In this figure as well as later figures, elements corresponding to those in an earlier figure will generally be denoted with the same reference numeral.) This system also contains a low-resolution, double-telecentric projection system 1, but in this embodiment the projection system functions to focus an image source 11 onto the microlens array 2. The image source comprises an array of light-modulating source elements (e.g., spots or pads of variable reflectivity), with each source element being imaged onto a corresponding microlens element. The image source could be a Digital Micromirror Device (or DMD, Ref. 3), with each source element comprising an individual micromirror pixel element. Each microlens images the projection aperture 7 onto a corresponding microspot on the printing surface 12, and each source element controls the exposure level over the corresponding microspot. The image source 11 is illuminated in reflection mode from the illumination system 9, using a beam splitter 13 to merge the illumination into the light path.

This system differs in a couple of respects from the microlens photolithography invention of Hugle et. al. (Ref's. 4, 5). Hugle's system does not use a single projection aperture for the entire microlens array (as illustrated in FIG. 2), but rather comprises an array of microlens units with separate, parallel optical paths. Also, Hugle's microlenses are non-scanning, wide-field imaging devices, each covering an image field comparable in size to the microlens aperture dimension. In contrast, the present invention uses a scanning technique to achieve full-field coverage with microlenses whose instantaneous image fields (i.e. the microspots) are at least an order of magnitude smaller than the microlens apertures. (As with the confocal microscope embodiment, the lithograhy system's microspots are defined by the diffraction-limited images of the projection aperture through the microlenses, and would preferably be comparable in size to the microlenses' diffraction point spread function.)

Figure 3:
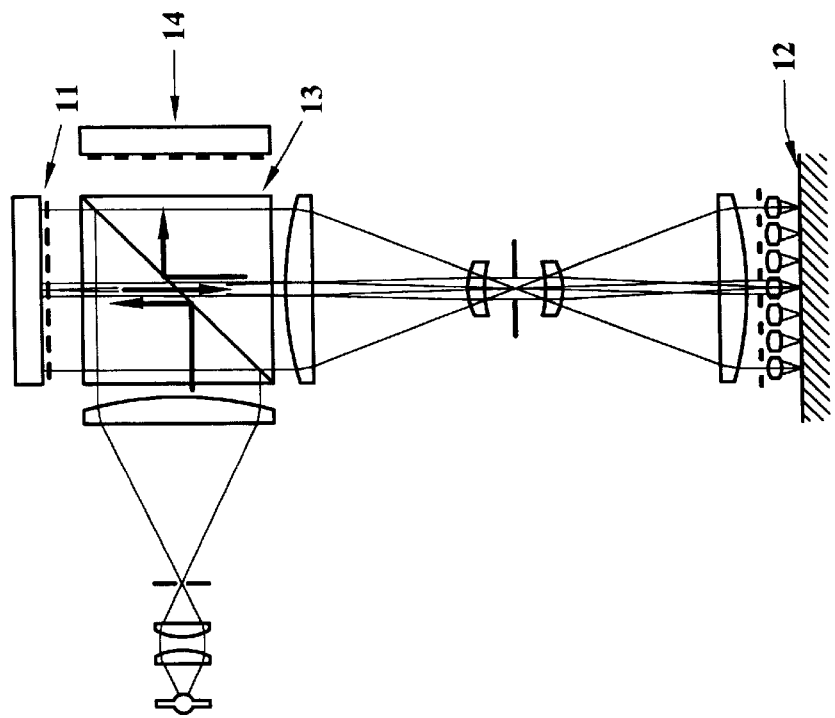
FIG. 3 illustrates a variant of the lithography system which combines the printing and microscopic imaging functions in a single device.

FIG. 3 illustrates a variant of the lithography system which combines the printing and microscopic imaging functions in a single device. This is similar to the FIG. 2 system, except that reflected light from the printing surface 12 is split out of the light path by the beam splitter 13 and directed onto an optical detector array 14. (A typical system might use two wavelengths such as a UV wavelength for exposure and a HeNe laser wavelength for imaging.) The detector could sense alignment marks on the printing surface, and it could take advantage of the accurate depth discrimination of confocal imaging to sense focus height variations across the surface. The position information would be used by a closed-loop servomechanism to control registration alignment and/or focus and tilt. The servomechanism could also correct for warp distortion in either the printing surface or the microlens array by applying a compensating stress distribution around the array's periphery.

In each of the above embodiments the sample or printing surface is scanned so that the microlenses' focal point array traces out a complete raster image. (Alternatively, the microlens system itself could be scanned relative to a fixed sample or printing surface.)

Figure 4:
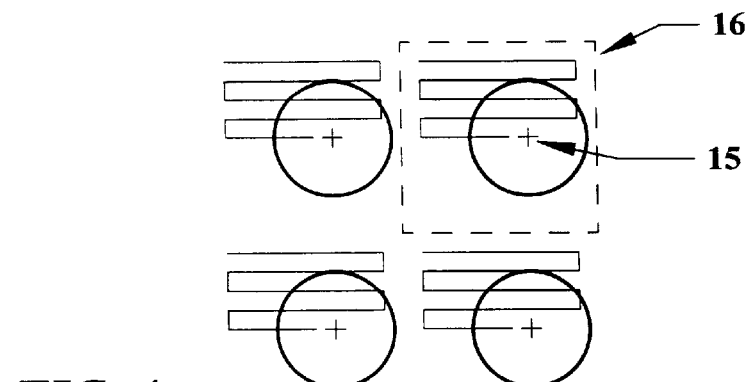
FIGS. 4–6 illustrate several alternative scan patterns that could be used, including the bi-directional raster scan (FIG. 4), continuous line scan (FIG. 5), and segmented line scan or "multiscan" (FIG. 6)
Figure 5:
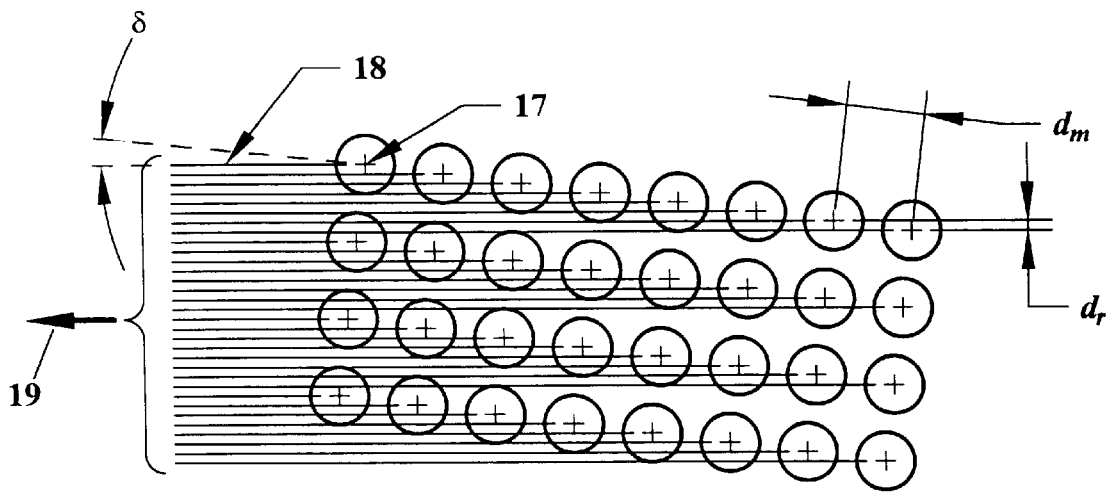
Figure 6:
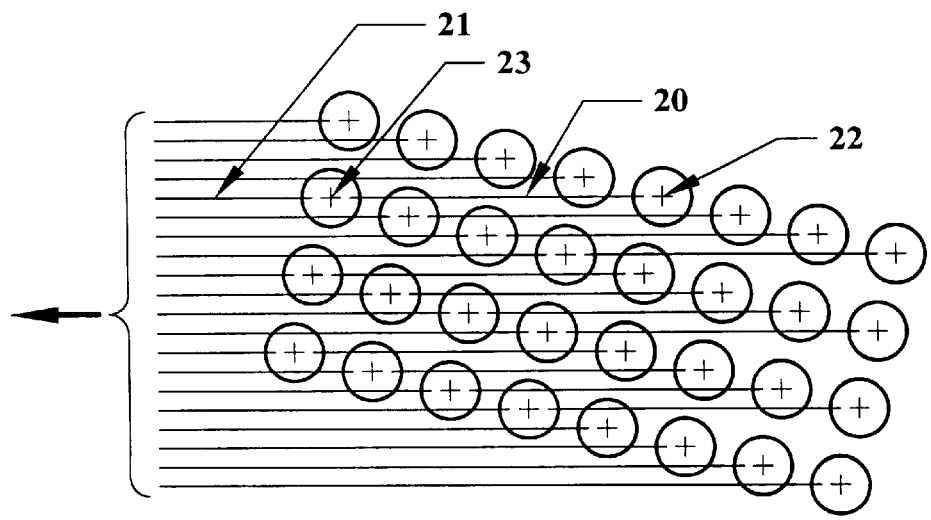

FIGS. 4–6 illustrate several alternative scan patterns that could be used, including the bi-directional raster scan (FIG. 4), continuous line scan (FIG. 5), and segmented line scan or "multiscan" (FIG. 6). With the bi-directional raster scan (FIG. 4) the image surface is divided into an array of square or rectangular cells with cell dimensions matching the microlens center spacing, and the surface is scanned bi-directionally so that each focal point 15 scans a pattern of raster lines covering a single cell 16. With the continuous line scan (FIG. 5) each focal point 17 scans just one raster line 18 extending across the entire image field. The microlenses are arranged in rows that are skewed relative to the scan direction 19 by a small angle δ so that the focal points trace out a pattern of closely-spaced raster lines, i.e., with the raster line period dr being much smaller than the microlens center spacing $d_m$. ($d_r = d_m \sin \delta$.) The segmented line scan (FIG. 6) is similar, except that each raster line is divided into a number of segments (e.g., segments 20 and 21) that are scanned by different lens foci (e.g., 22 and 23).

The "multiscan" imaging mode is similar to the segmented scan (FIG. 6), except that the scan segments overlap so that each raster line is scanned more than once. Multiscan imaging could have a variety of uses. One application would be to create color images or prints by varying the illumination chromaticity between successive scans. (For example, line segment 20 in FIG. 6 would be scanned first by lens focus 22, and then again by focus 23 with different illumination.) A microscope system could use also use multiscan imaging to create three dimensional images by tilting the microlens array slightly relative to the scan direction so that successive image scans are acquired at slightly different focal depths. (Alternatively, rather than tilting the microlens array, a distribution of focal plane heights could be designed into the array.) In a lithography system, the illumination brightness could be varied between successive scans in order to provide control of the exposure dose. (This would be useful if the image source does not provide gray level control. With N scans, each at a different illumination level, the total number of possible exposure dose levels is $2^N$.) Alternatively, a lithography system might use redundant scanning simply to minimize statistical imaging errors due to factors such as microlens defects.

The microlens scanner design principles, components, and subsystems will be described in greater detail below, with the primary emphasis being on microlithography and semiconductor wafer production. (Much of the specification applies directly to microscopy and other applications, however.) A practical embodiment of the microlithography system might use a continuous deep-UV laser light source such as a frequency-quadrupled 266 nm Nd:YAG laser (Ref. 6) and a DMD image source similar to a prototype device that has been demonstrated with about 2,000,000 pixels (Ref. 3). The DMD is capable of operating at a frame rate of over 10 kHz, resulting in a pixel rate of $2 \cdot 10^{10}$ pixels/sec. Assuming a raster line period of about 0.1 micron the exposure area rate would be 2 cm²/sec. The system could use a catadioptric projection optics system whose simple, compact design would make it possible to combine multiple microlens scanner units in one machine, resulting in a total throughput on the order of 10 cm²/sec.

Microlens Imaging Theory and Technique

The basic imaging characteristics of microlens arrays can be derived using methods of Fourier optics. (This assumes a small numerical aperture with insignificant optical aberrations, but these methods can nevertheless provide a useful first approximation to the properties of microlenses with numerical aperture of about 0.5 or less.)

We will denote by (X, Y) a microlens's focal plane field coordinates, and by (X', Y') its aperture plane coordinates (FIG. 7). The analysis will be simplified by introducing dimensionless field coordinates (x,y) and aperture coordinates (x',y'):

$$x = X/\lambda, \ y = Y/\lambda \qquad \text{Eq 1}$$

$$x' = -X'/F_m, \ y' = -Y'/F_m \qquad \text{Eq 2}$$

where λ is the exposure wavelength and $F_m$ is the microlens focal length (FIG. 7). The (scalar) electric field amplitude distribution on the focal plane will be denoted as A[x, y], and the electric field distribution on the microlens aperture plane will be denoted as A'[x', y']. (Note: Square brackets "[ . . . ]" are used here as function argument delimiters; round brackets "( . . . )" are used for grouping.) Ignoring an insignificant phase factor, A and A' are related approximately by a Fourier transform relationship:

$$A'[x',y'] = \iint A[x,y] \exp[i 2\pi (xx'+yy')] dx \, dy \qquad \text{Eq 3}$$

$$A[x,y] = \iint A'[x',y'] \exp[-i 2\pi (xx'+yy')] dx' \, dy' \qquad \text{Eq 4}$$

(An electric field time separation factor of $\exp[+i\omega t]$ is assumed, and all integrals are taken from $-\infty$ to $\infty$.) The instantaneous energy distribution produced at the focal plane is proportional to $|A[x, y]|^2$. (This assumes that there is no significant overlap between distributions from adjacent microlenses, which is a safe assumption because the microlenses' center spacing would typically be over an order of magnitude larger than the diffraction-limited spot size.) If the spots are "flash exposed" using a pulsed light source (such as an excimer laser) the total exposure dose E[x, y] after completing an entire scan will be an incoherent superposition of diffraction-limited, overlapping microspot distributions laid out on a grid pattern:

$$E[x, y] = \sum_{j,k} g_{jk} |A[x - js, \ y - ks]|^2 \qquad \text{Eq 5}$$

where s is the grid size (in wavelength units) and $g_{jk}$ is the exposure gray level (on a scale of 0 to 1) at point (x, y)=(js, ks). If a continuous light source is used there would be some smearing of the microspots due to motion of the wafer while each spot is being exposed, but this "point smearing" effect is neglected here. The image would typically be exposed using a grid size s equal to the raster line period $d_r$ (FIG. 5), or some multiple thereof, normalized to the wavelength:

$$s = md_r/\lambda \qquad \text{Eq 6}$$

where m is an integer.

Three exposure distributions are of primary importance in microlens imaging: the point distribution $E_{point}[x, y]$ which is obtained when point $(x, y)=(0, 0)$ is exposed at unit gray level and all other points are unexposed, the line distribution $E_{line}[x, y]$ which is obtained when all grid points on the line $x=0$ are exposed at unit gray level and all others are unexposed, and the plane distribution $E_{plane}[x, y]$ which is obtained when all grid points are exposed at unit gray level.

$$E_{point}[x, y] = |A[x, y]|^2 \qquad \text{Eq 7}$$

$$E_{line}[x, y] = \sum_{k=-\infty}^{\infty} |A[x, y - ks]|^2 \qquad \text{Eq 8}$$

$$E_{plane}[x, y] = \sum_{j=-\infty}^{\infty} \sum_{k=-\infty}^{\infty} |A[x - js, y - ks]|^2 \qquad \text{Eq 9}$$

A fundamental result from Fourier optics is that if the grid size is within the limit $$s < 1/(2NA_m) \qquad \text{Eq 10}$$

where $NA_m$ is the microlens numerical aperture, then $E_{plane}[x, y]$ reduces to a constant and $E_{line}[x, y]$ has a uniform cross section in x (i.e., it has no y dependence):

$$E_{plane} = (\int\int |A[x,y]|^2 dx dy)/s^2 \qquad \text{Eq 11}$$

$$E_{line}[x] = (\int |A[x,y]|^2 dy)/s \qquad \text{Eq 12}$$

(These results, which we will respectively designate the "plane exposure theorem" and the "line exposure theorem," are derived in sections near the end of this description below. Note that with a positive resist the $E_{plane}$ distribution will result in all the resist being dissolved, $E_{line}$ will develop to an isolated linear space, and $E_{point}$ will develop to an isolated hole.) Eq's 11 and 12 can alternatively be expressed in terms of aperture integrals instead of field integrals, $$E_{plane} = (\int\int |A'[x',y']|^2 dx' dy')/s^2 \qquad \text{Eq 13}$$

$$E_{line}[x] = (\int |\int A'[x',y'] \exp[-i2\pi x x'] dx'|^2 dy')/s \qquad \text{Eq 14}$$

For the special case of a uniformly-illuminated circular aperture, the aperture function A' has the form $$A'[x', y'] = \begin{cases} A'_0 & \text{for } \sqrt{x'^2 + y'^2} < NA_m; \\ 0 & \text{otherwise} \end{cases} \qquad \text{Eq 15}$$

where $A'_0$ is a constant. Its inverse Fourier transform A has the form $$A[x, y] = A'_0 NA_m J_1\left[2\pi NA_m \sqrt{x^2 + y^2}\right] / \sqrt{x^2 + y^2} \qquad \text{Eq 16}$$

where $J_1$ is a Bessel function of the first kind. (Eq 16 represents the classical Airy diffraction pattern.) Substituting Eq's 15 and 16 in Eq's 7, 13, and 14, we obtain:

$$E_{point}[x, y] = E_{plane} s^2 J_1\left[2\pi NA_m \sqrt{x^2 + y^2}\right]^2 / (\pi(x^2 + y^2)) \qquad \text{Eq 17}$$

$$E_{line}[x] = E_{plane}(s/(NA_m \pi^3 x^2))\left(1 - {}_1F_2\left[1; \frac{1}{2}, \frac{3}{2}; -(2\pi NA_m x)^2\right]\right) \qquad \text{Eq 18}$$

where ${}_1F_2$ is a generalized hypergeometric function. The peak values of these distributions are $$E_{point}[0,0] = E_{plane} s^2 NA_m^2 \pi \qquad \text{Eq 19}$$

$$E_{line}[0] = E_{plane} s 16 NA_m/(3\pi) \qquad \text{Eq 20}$$

From Eq 10 we obtain the following maximum limits on $E_{point}[0,0]$ and $E_{line}[0]$:

$$E_{point}[0,0] < E_{plane} \pi/4 \qquad \text{Eq 21}$$

$$E_{line}[0] < E_{plane} 8/(3\pi) \qquad \text{Eq 22}$$

FIG. 8 illustrates the point, line, and plane exposure profiles for $NA_m=0.5$ and $s=1$. (For smaller step sizes $E_{point}/E_{plane}$ scales in proportion to $s^2$ and $E_{line}/E_{plane}$ scales in proportion to s.)

The plane exposure theorem implies a useful image reversal characteristic of microlens array scanners: If the illumination level is set so that the resist solubility threshold $E_S$ is at $E_{plane}/2$, then image reversal can be achieved by simply inverting the image gray levels (i.e., substitute $g_{jk} \leftarrow 1 - g_{jk}$ at each exposure point). For example, FIG. 9 illustrates the exposure profile (E vs X) for an image feature and its complement. The feature has an exposure profile $E_a$ which is produced by the gray level distribution $g_{jk}$, $$E_a[x, y] = \sum_{j,k} g_{jk} |A[x - js, y - ks]|^2 \qquad \text{Eq 23}$$

Under image reversal, the exposure distribution $E_a$ is transformed to distribution $E_b = E_{plane} - E_a$, $$E_b[x, y] = \sum_{j,k} (1 - g_{jk}) |A[x - js, y - ks]|^2 = E_{plane} - E_a[x, y] \qquad \text{Eq 24}$$

(from Eq 9). The two exposure profiles cross the solubility threshold $E_S$ at the same points (since $E_S = E_{plane} - E_S$); hence they will develop to the same width dimension W. (If the image source provides gray level control, the image reversal process does not require that the solubility threshold $E_S$ be at $E_{plane}/2$ because the positive and negative images' gray levels could be independently scaled so that any desired exposure contour is at $E_S$.)

Image features comprising closed contours enclosing high-exposure areas can be termed "positive," whereas the complementary features (closed contours enclosing low-exposure regions) can be termed "negative." FIG. 10 illustrates constant-exposure contours at $0.25E_{plane}$, $0.5E_{plane}$, and $0.75E_{plane}$ for several positive line images of varying length constructed with $NA_m=0.5$. (With a positive resist these patterns would develop into linear spaces.) The exposure points, indicated by "+" marks, are all exposed at unit gray level and are separated by $1.5\lambda$ in X and by $\lambda$ in Y. Although the line and plane exposure theorems generally apply only to infinite lines and planes, short linear or rectangular features such as those in FIG. 10 could be formed with fairly straight contours and uniform cross sections. The straightness and uniformity could be improved by using gray level control and a small grid step (e.g., s=0.5).

Figure 11A:
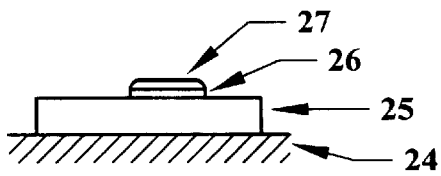
FIGS. 11a–f illustrate a multilevel processing procedure for effecting the logical operations of conjunction (logical AND) and disjunction (logical OR)
Figure 11B:
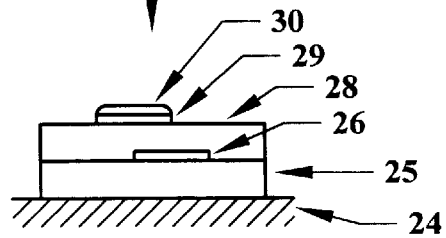
Figure 11C:
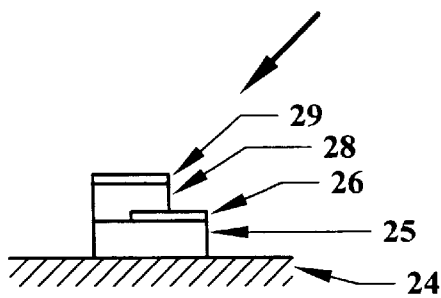

Simple image patterns such as those illustrated in FIG. 10 can be combined to create small, sharply detailed patterns by using "boolean compositing" operations. The simplest such operation is image reversal (i.e., boolean negation), which can be effected by gray level inversion, as described above. Other logical operations such as conjunction (logical AND) and disjunction (logical OR) could be effected by a multi-level processing procedure such as that illustrated in FIGS. 11a–f. In FIG. 11a a wafer substrate 24 is spin-coated with a thick PMMA layer 25, a planarized spin-on-glass (SOG) layer 26, and a thin resist layer 27 which is exposed and developed to create an etched pattern in the SOG. In FIG. 11b the top resist is stripped and a second PMMA layer 28, SOG layer 29, and thin resist 30 are applied, and the top resist is exposed and developed to create a second etched pattern in the top SOG layer. In FIG. 11c the double-layer PMMA structure is reactive ion-etched down to the substrate, resulting in an etch mask that exposes a region on the substrate defined by the conjunction of the etched areas on the two SOG layers.

Figure 11D:
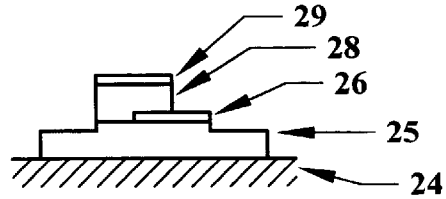
Figure 11E:
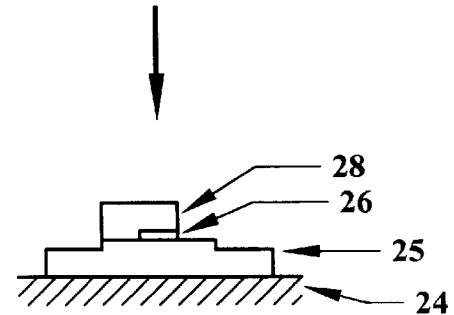
Figure 11F:
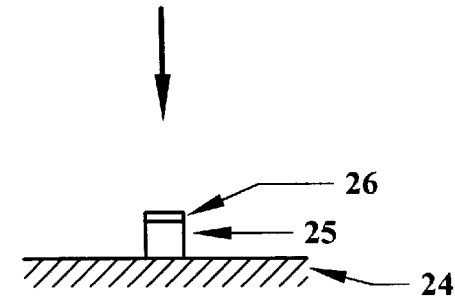

In a variation of the above process the top PMMA is only etched far enough to expose the bottom SOG layer (FIG. 11d). This is followed by a selective etch which removes the top SOG layer and the exposed portion of the lower SOG layer (FIG. 11e), and finally the remaining PMMA is etched down to the substrate (FIG. 11f). This process results in an etch mask defined by the disjunction of the two SOG etch patterns.

Figure 12:
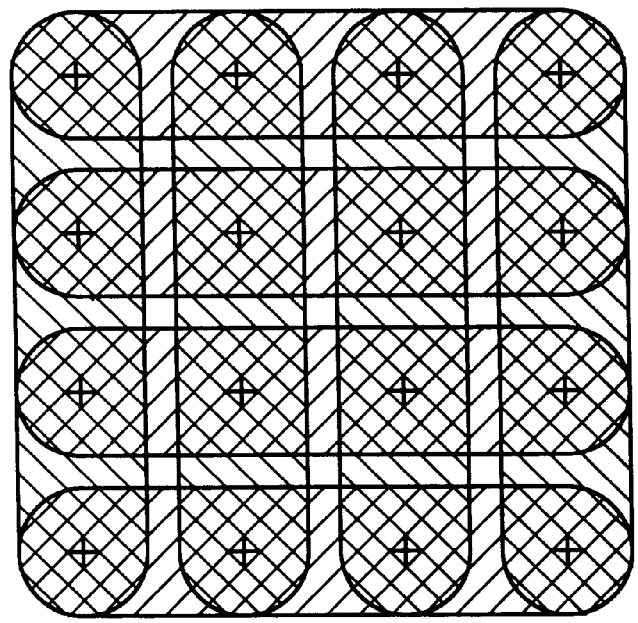
FIGS. 12 and 13 show simple illustrations of boolean compositing.
Figure 13:
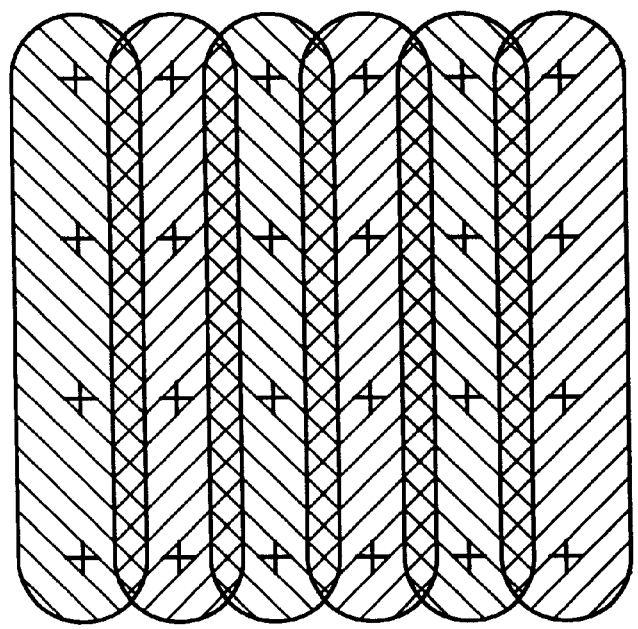

FIGS. 12 and 13 show simple illustrations of boolean compositing. In FIG. 12 an array of small, square islands is created by the disjunctive composition of two positive line patterns (indicated by opposite hatching). In FIG. 13 two parallel, overlapping sets of positive line patterns are conjunctively composited to form narrow spaces. Multiple sets of such patterns could be interleaved to form high-density arrays of very small features with the feature density exceeding the classical diffraction limit. (The feature size and density are primarily limited by the resist contrast and overlay accuracy.)

Aperture Design

Figure 14:
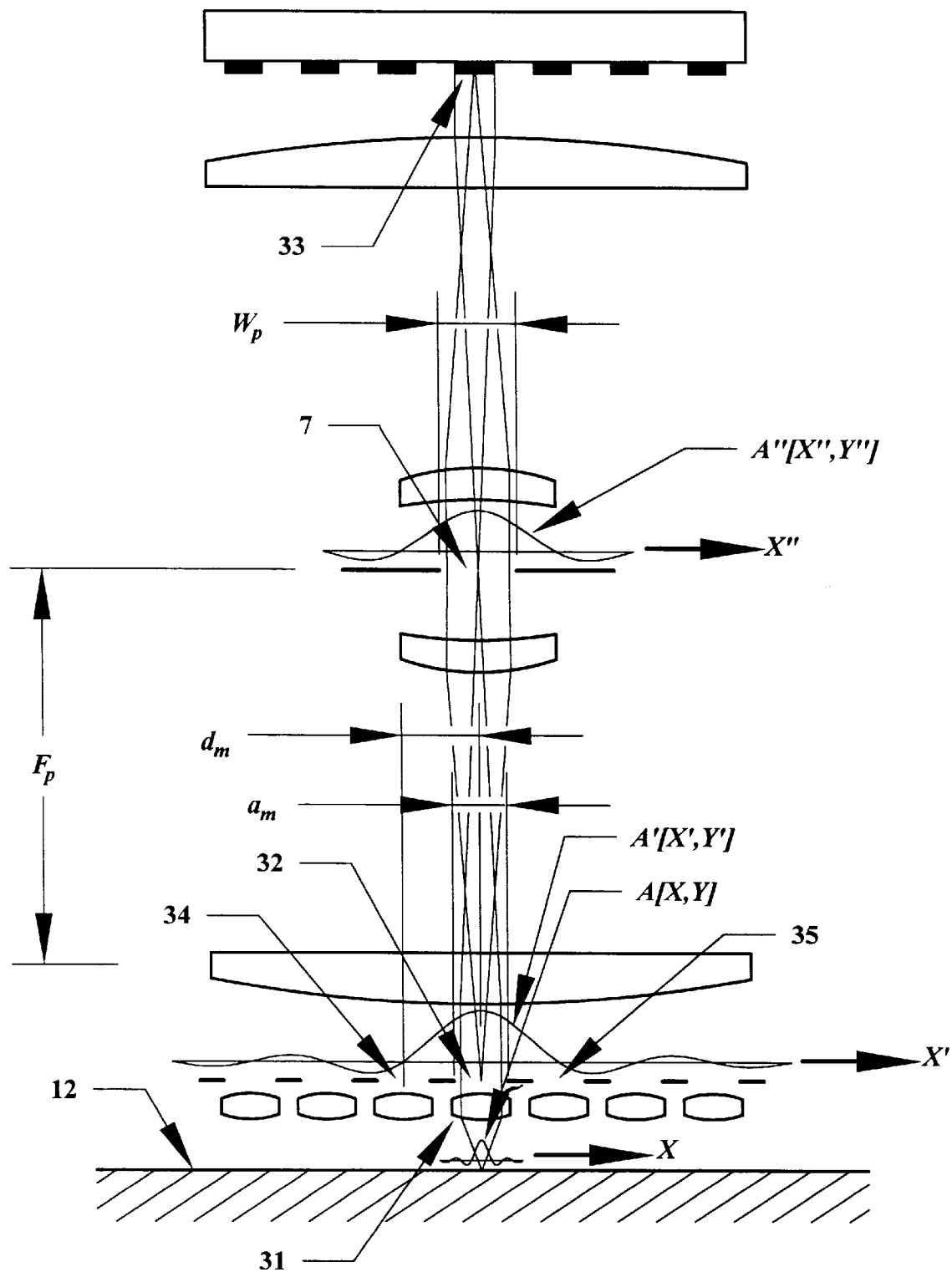
FIG. 14 illustrates the basic design tradeoffs relating to aperture sizing and microlens spacing.

The basic design tradeoffs relating to aperture sizing and microlens spacing are illustrated schematically in FIG. 14. Each microlens 31 focuses the beam down to a diffraction-limited focus spot with a tightly confined amplitude distribution $A[X, Y]$ on the wafer surface 12. This distribution is determined by the microlens's numerical aperture and by the amplitude distribution $A'[X', Y']$ over the microlens aperture 32. The latter distribution, which is the diffraction-limited image from the source element 33 corresponding to microlens 31, should preferably overfill the aperture 32 in order to optimize focus resolution on the wafer plane and also to minimize sensitivity of the focus spot to optical registration errors between the source elements and the microlens apertures. However, if the A' distribution is too broad (or if the microlenses are too closely spaced), it will also overlap adjacent microlens apertures 34 and 35, resulting in image cross-talk between adjacent apertures.

The A' distribution is determined by the projection system's numerical aperture and by the amplitude distribution $A''[X'', Y'']$ over the projection aperture 7. (A'' represents the portion of the aperture illumination that comes only from source element 33. The total aperture illumination field also includes similar distributions from all other source elements.) The source elements' aperture size can be chosen to optimally control the A'' distribution. If the source elements are much smaller than their center spacing then diffraction at element 33's aperture will cause the A'' distribution to be very evenly spread over the projection aperture 7, minimizing possible spreading or distortion of the projected image-plane distribution A' due to nonuniform aperture illumination. Also, sensitivity to misalignment of the illumination source can be minimized by making the source elements small. The tradeoff, however, is that optical efficiency would fall off in proportion to the source elements' aperture size due to overfilling of the projection aperture.

The projection aperture size and shape can be designed to optimize the tradeoff between illumination uniformity across the microlens aperture 32 versus minimizing light leakage into adjacent apertures 34 and 35. One approach could be to use a square aperture 7 aligned to the microlens grid. The square-aperture amplitude transmittance function $t_p[X'', Y'']$ is $$t_p[X'', Y''] = \begin{cases} 1 & \text{for } |X''| < W_p/2 \text{ and } |Y''| < W_p/2; \\ 0 & \text{otherwise} \end{cases} \quad \text{Eq 25}$$

where $W_p$ is the projection aperture width. Assuming that the A'' distribution is substantially uniform within the projection aperture, a square aperture will result in a microlens aperture distribution A' described approximately by the function $$A'[X',Y']=A'_0 \sin c[W_p X'/(\lambda F_p)] \sin c[W_p Y'/(\lambda F_p)] \quad \text{Eq 26}$$

where $A'_0$ is a constant, $F_p$ is the focal length of the optical subsystem between the projection aperture 7 and microlens aperture 32, $\lambda$ is the exposure wavelength, and $\text{sinc}[u]=\sin[\pi u]/(\pi u)$. The aperture width $W_p$ can be chosen so that the first nodes of the sinc function are approximately centered on the adjacent microlens apertures 34 and 35:

$$W_p = \lambda F_p / d_m \quad \text{Eq 27}$$

where $d_m$ is the microlens center spacing. In this case, Eq's 25 and 26 become:

$$t_p[X'', Y''] = \begin{cases} 1 & \text{for } |X''| < \lambda F_p/(2d_m) \text{ and } |Y''| < \lambda F_p/(2d_m); \\ 0 & \text{otherwise} \end{cases} \quad \text{Eq 28}$$

$$A'[X', Y'] = A'_0 \text{sinc}[X'/d_m]\text{sinc}[Y'/d_m] \quad \text{Eq 29}$$

If $d_m$ is, for example, four times the microlens aperture width $a_m$ (FIG. 14), the illumination intensity nonuniformity over the aperture 32 will be only about 5% (not enough to significantly impair focus resolution on the wafer plane) and the energy leakage into each adjacent aperture 34 or 35 will be about 0.4%, assuming circular microlens apertures.

The cross-talk amplitude component would not give rise to any significant coherence effects. For example, the primary amplitude distribution $A'[X', Y']$ over microlens aperture 32 is superimposed with cross-talk distributions $A'[X'+d_m, Y']$ and $A'[X'-d_m, Y']$ from adjacent source elements 34 and 35. Each of the cross-talk distributions is approximately odd-symmetric in X' over aperture 32 whereas $A'[X', Y']$ is even-symmetric. This implies (based on the properties of Fourier transforms) that at the wafer plane the cross-talk amplitude will be approximately pure complex, whereas $A[X, Y]$ will be real-valued, resulting in minimal coherence interaction. This assumes that the illumination is coherent and that the source elements are coherently aligned. (If there are significant phase shifts between adjacent elements the cross-talk energy leakage could be much higher than the level indicated above, e.g., 0.4%, due to coherence interactions.)

There are variants of the square-aperture design outlined above that could result in even better cross-talk suppression. One alternative is to align the aperture at a 45° angle relative to the microlens grid and set its size so that both sinc terms in the A' distribution are zero at the center of adjacent microlens apertures 34 and 35:

$$t_p[X'', Y''] = \begin{cases} 1 & \text{for } |X'' + Y''| < \lambda F_p / d_m \text{ and } |X'' - Y''| < \lambda F_p / d_m; \\ 0 & \text{otherwise} \end{cases}$$ Eq 30

$$A'[X', Y'] = A_0' \text{sinc}[(X' + Y')/d_m]\text{sinc}[(X' - Y')/d_m]$$ Eq 31

Another approach is to use an apodized projection aperture which essentially replaces the square-aperture amplitude transmittance function of Eq 28 by its autoconvolution. With this modification the sinc functions in A' are replaced by sin $c^2$ terms, so over the adjacent apertures where A' has zero crossings the cross-talk amplitude becomes negligible:

$$t_p[X'', Y''] = \begin{cases} (1 - |X''d_m/(\lambda F_p)|)(1 - |Y''d_m/(\lambda F_p)|) \\ \quad \text{for } |X''| < \lambda F_p/d_m \text{ and } |Y''| < \lambda F_p/d_m; \\ 0 \quad \text{otherwise} \end{cases}$$ Eq 32

$$A'[X', Y'] = A_0' \text{sinc}^2[X'/d_m]\text{sinc}^2[Y'/d_m]$$ Eq 33

(These variant approaches have the disadvantage that either the illumination uniformity over the microlens aperture 32 would be compromised or the microlens spacing $d_m$ would have to be increased to maintain illumination uniformity.)

The apodization approach can also be implemented by a slightly different technique. Rather than forming an actual physical apodizer at the projection aperture, the beam can be "effectively apodized" by designing the aperture illumination field A" so that it has a tapered profile over the aperture region similar to an apodization profile. For example, if the illumination optics and image source are designed so that the A" distribution's first diffraction nodes are at the projection aperture edges, the tapered amplitude distribution near the edges will tend to repress the diffraction tails in the image-plane distribution A'. (The tradeoff to this advantage, however, is that the system will be less tolerant of any misalignment or vibration that could cause the A" distribution to shift.) Similarly, the microlens apertures could be effectively apodized by locating the first diffraction nodes of the A' distribution at the microlens aperture boundary. This would tend to repress the diffraction tails in the wafer-plane distribution A, though at the expense of increasing the central peak width.

The aperture design approaches outlined above can be applied to microscopy systems as well as lithography printers. (For the microscopy application the source elements 33 in FIG. 14 can be reinterpreted as detector elements.)

It should be noted that there is one application for which image cross-talk would not be a problem. If the system is used to print a periodic pattern, with the pattern periodicity matching the microlens layout, then the exposure intensities at all the microspots would be identical; so any cross-talk effect could be corrected by making a compensating adjustment in the overall exposure level. For this application an image source array would not even be required—it could simply be replaced by a modulated point source at the center of the projection aperture which would uniformly illuminate the entire microlens array. This type of system could be used, for example, in the manufacture of microlens arrays, wherein the image-plane microlens array would be used as a mastering element to lithographically pattern replica elements.

(However, an alternative manufacturing technique described below could have advantages over this method.)

Microlens Construction

Figure 15:
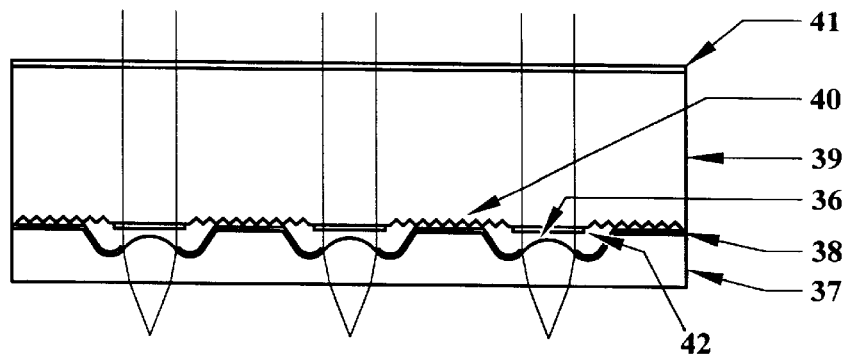
FIG. 15 illustrates a possible configuration for the microlens design.

FIG. 15 illustrates a possible configuration for the microlens design. Each microlens is formed as a surface relief profile 36 on the top surface of a thin fused silica plate 37. A lithographically patterned light-blocking layer 38 such as dark chrome is deposited on the top of the plate to define the microlens apertures. The plate is optically contacted and bonded to a thick fused silica superstrate 39. Portions of the superstrate's bottom surface are etched to form a light-scattering or diffracting surface 40 which represses the specular reflected beam over the optically contacted regions of the plate. The superstrate's top surface has an antireflection coatings 41, and the bottom surface has an antireflection coating 42 over the microlens clear aperture areas. (The scattering or diffractive surface areas and the antireflection coatings prevent the specularly reflected light from transmitting back through the projection aperture.)

Figure 16A:
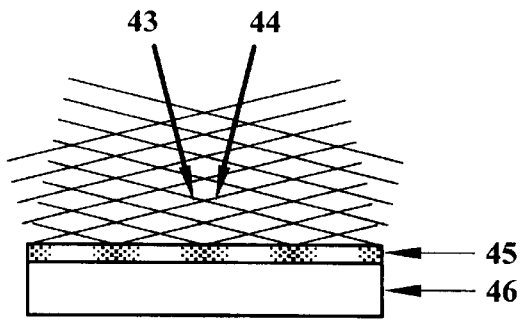
FIGS. 16a–g illustrate a fabrication process based on laser-assisted chemical etching.
Figure 16E:
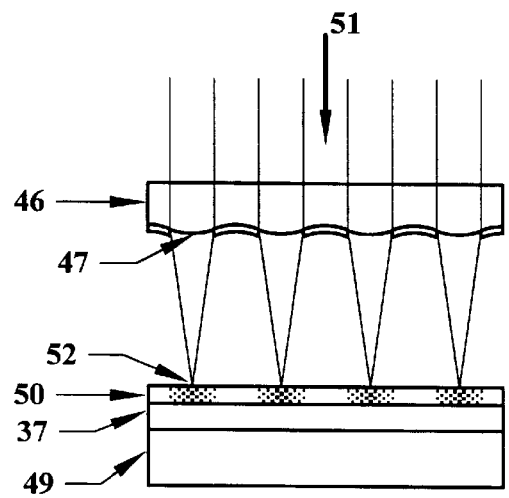
Figure 16B:
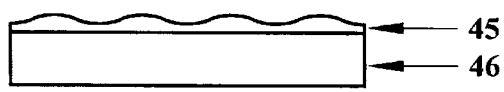
Figure 16C:
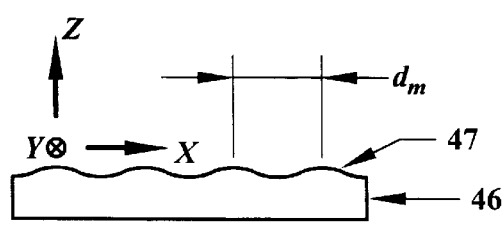
Figure 16F:
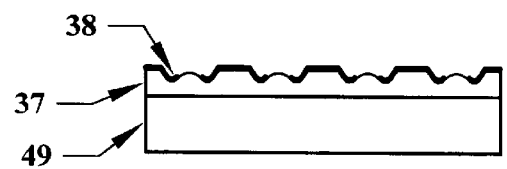
Figure 16D:
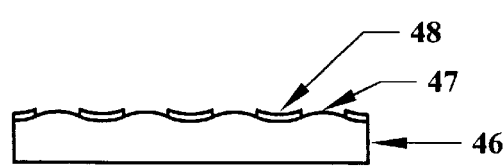
Figure 16G:
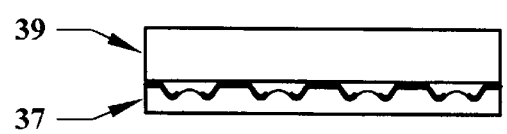

A fabrication process based on laser-assisted chemical etching (Ref's. 7, 8) is illustrated in FIGS. 16a–g. The basic procedure is to first form an array of low-NA microlenses using a holographic construction process (FIGS. 16a–d), and then to use this array as a mastering element for replicating arrays of accurately-profiled, high-NA microlenses (FIGS. 16e–g). In FIG. 16a a pair of accurately collimated, uniform laser beams 43 and 44 are combined to form an interference pattern which exposes a thick resist layer 45 on a fused silica substrate 46. The substrate is then rotated 90° and exposed a second time, so the latent resist image consists of two orthogonal sets of uniformly-spaced parallel lines. The latent image is developed into a sinusoidal thickness variation in the resist (FIG. 16b), which is converted to a sinusoidal surface profile 47 in the substrate by a reactive ion etching process (FIG. 16c; Ref's. 7, 8). The surface height profile Z[X, Y] consists of crossed sinusoids, $$Z[X,Y] = Z_0(\cos^2[\pi X/d_m] + \cos^2[\pi Y/d_m])$$ Eq 34 where $d_m$ is the holographic pattern's line period and $Z_0$ is a constant. The shape is approximately paraboloidal in the vicinity of the profile peaks; for example near (X, Y)=(0,0) the profile function takes the approximate form $$Z[X,Y] = Z_0(2 - (\pi/d_m)^2(X^2 + Y^2))$$ Eq 35

These paraboloidal regions can function as microlens elements, and an aperture array 48 is formed on the surface to delimit these areas (FIG. 16d). The aperture array is formed as a lithographically-patterned chrome layer which is holographically constructed using the exposure setup of FIG. 16a to ensure accurate registration of the aperture array with the microlenses.

The low-NA microlens array can be used as a proximity mask for fabricating the high-NA array (FIG. 16e). A thin fused silica plate 37 is optically contacted to a thick supporting substrate 49 and is overcoated with resist 50. An exposure beam 51 is projected through the low-NA microlens array 46, which focuses the beam onto an array of small spots on the resist (e.g., microlens 47 focuses the beam onto spot 52). Each microlens images an optimal exposure distribution at its focal plane, resulting in an optimally-contoured surface profile in the developed resist. (The imaging optics will be described below.) The resist profile is transferred into the fused silica plate 37 by reactive ion etching, and a lithographically-patterned aperture array 38 is then formed on the surface (FIG. 16f). (The low-NA microlens array 46 can also be used to lithographically pattern the aperture array.) Finally, the silica plate 37 is bonded to the superstrate 39 and is detached from the substrate 49 (FIG. 16g).

Figure 17:
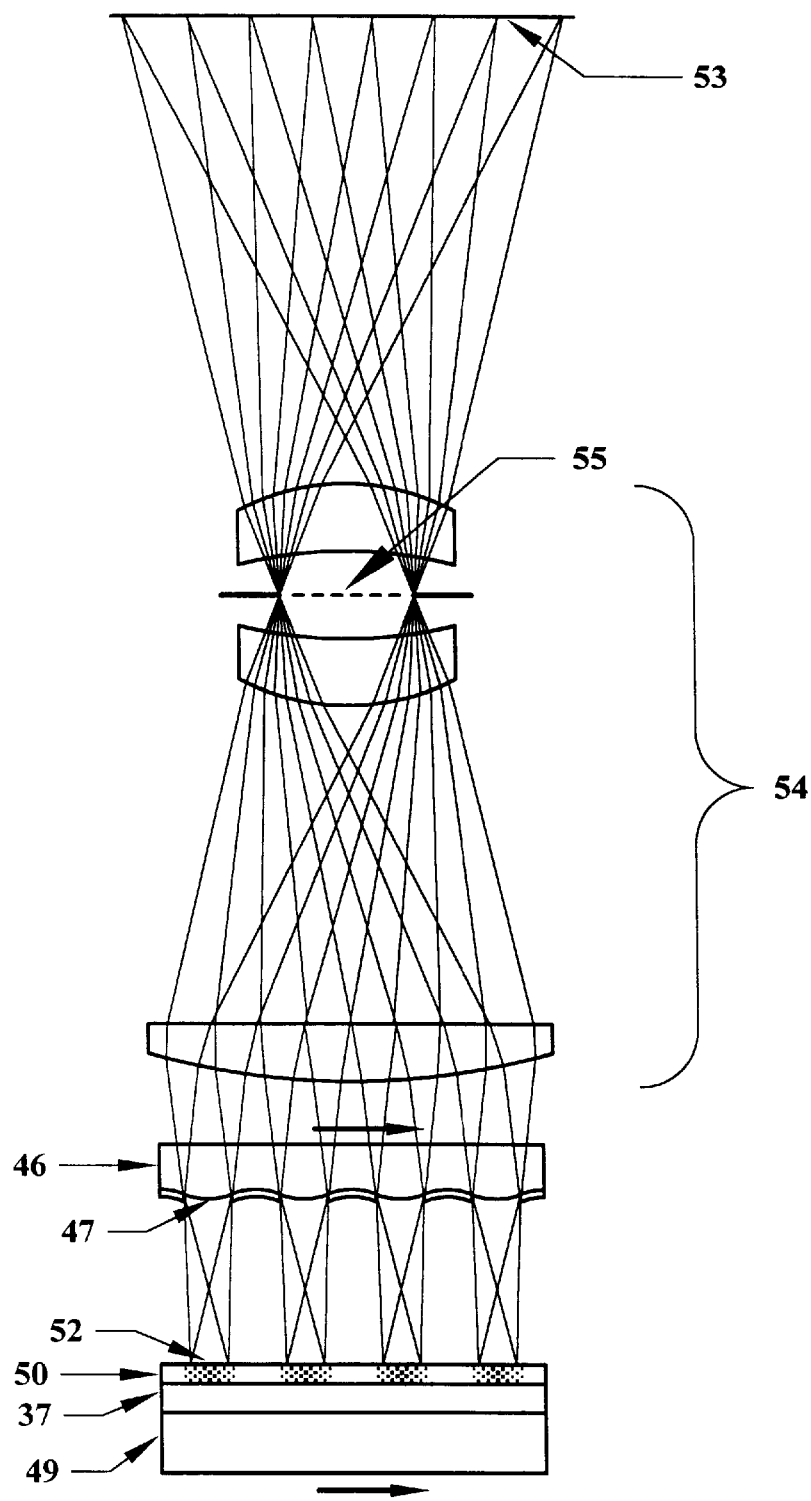
FIG. 17 illustrates the exposure process for microlens replication.

The exposure optics used in the replication process (FIG. 16e) is illustrated in FIG. 17. An extended, diffuse light source 53 is focused by a projection system 54 onto the mastering element 46. The projection system's aperture stop contains a gray-scale transmittance mask 55 which is imaged by each microlens 47 onto its corresponding exposure spot 52. The mask's transmittance profile controls the resist exposure distribution, which in turn determines the replica microlenses' surface profile shape 36 (FIG. 15). The substrate 49 and mastering element 46 are scanned across the beam during exposure (keeping their relative position fixed) in order to average out exposure nonuniformities due to factors such as the projection system's field nonuniformity and coherence effects. The projection system 54 should designed to be telecentric on the object side so that the multiple images of the aperture mask 55 remain fixed relative to the resist 50 as elements 46 and 49 are scanned across the illumination field.

An advantage of the above fabrication method is that the uniformity and placement accuracy of the replica microlenses are not limited by the exposure tool's field uniformity or stepping accuracy—they are determined only by the uniformity and collimation accuracy of the exposure beams 43 and 44 used to fabricate the mastering element (FIG. 16a). Furthermore, the replica microlens arrays can be much larger than the exposure tool's image field.

Numerous alternatives to reactive ion-etched microlenses exist for either the mastering microlens elements or the replica array. Possibilities include molded microlenses, distributed-index planar microlenses, micro-Fresnel lenses (or binary optics), and melted-resin arrays (Ref. 9, Chap. 7). Although their material processing technologies differ, most of these microlenses types are fabricated using photolithography, so the exposure techniques described above can be adapted to these alternative types as well. One practical variation of the above process, for example, would be to form the mastering microlenses 47 as distributed-index planar elements. The air space between the mastering element 46 and resist 50 (FIGS. 16e, 17) could then be replaced by a dielectric layer which is deposited over the mastering element 46. The replica microlenses would thus be formed by a contact printing process, rather than by proximity printing, which has the advantage that the critical air space tolerance requirement would be eliminated.

Projection and Illumination Optics

In the context of a lithography system (FIG. 2) the image source 11 defines the object plane of the projection system 1, and the microlens array 2 defines its image plane. The projection system should generally be telecentric on the image side since the optical axes of the individual microlenses will typically all be mutually parallel. If an image source such as a DMD is used the projection system should also be telecentric on the object side. The FIG. 2 configuration uses a collimating lens 56 to image the projection aperture 7 to infinity on the image side, and a collimating lens 57 is also used to image the aperture to infinity on the object side. An aperture lens (or lens system) 58 which contains the projection aperture 7 functions in conjunction with collimators 56 and 57 to image the image source 11 onto the microlens array 2. (The image source and microlens array could be positioned so that the collimators alone perform this imaging function, but a zero-power aperture lens 58 might still be needed for aberration control.)

Figure 18:
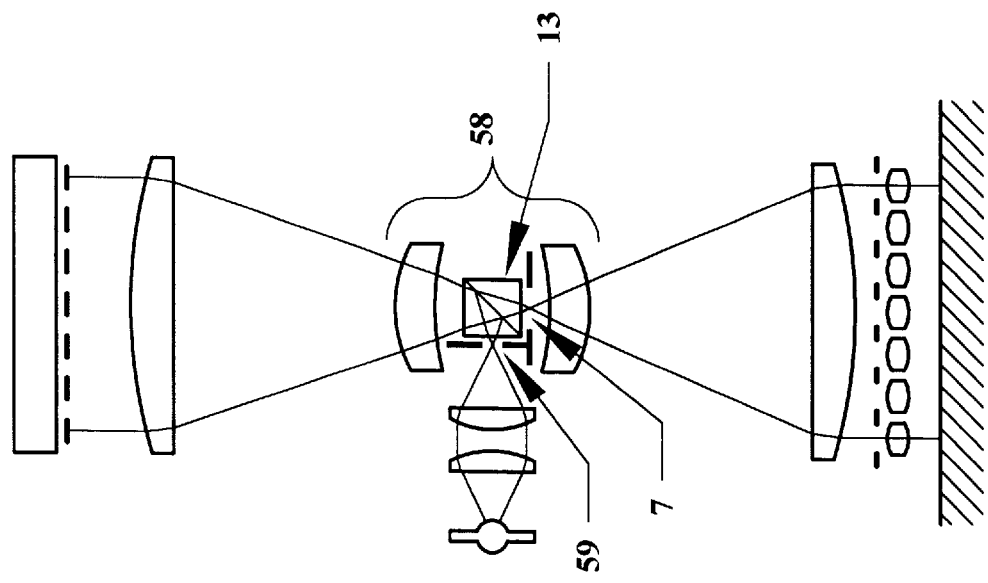
FIG. 18 illustrates an alternative design configuration which simplifies the illumination optics.

The illumination system 9 in FIG. 2 contains an illumination aperture 59 which is imaged by a collimator 60, the beam splitter 13, and the projection optics onto the projection aperture 7. An alternative design configuration which simplifies the illumination optics is illustrated in FIG. 18. In this system the beam splitter 13 is incorporated within the aperture lens 58 and the projection aperture 7 and illumination aperture 59 are both formed directly on the beam splitter surface. Advantages of this system are that the beam splitter is very small and compact, and optical alignment is simplified because the apertures 7 and 59 are automatically aligned to each other.

Figure 19:
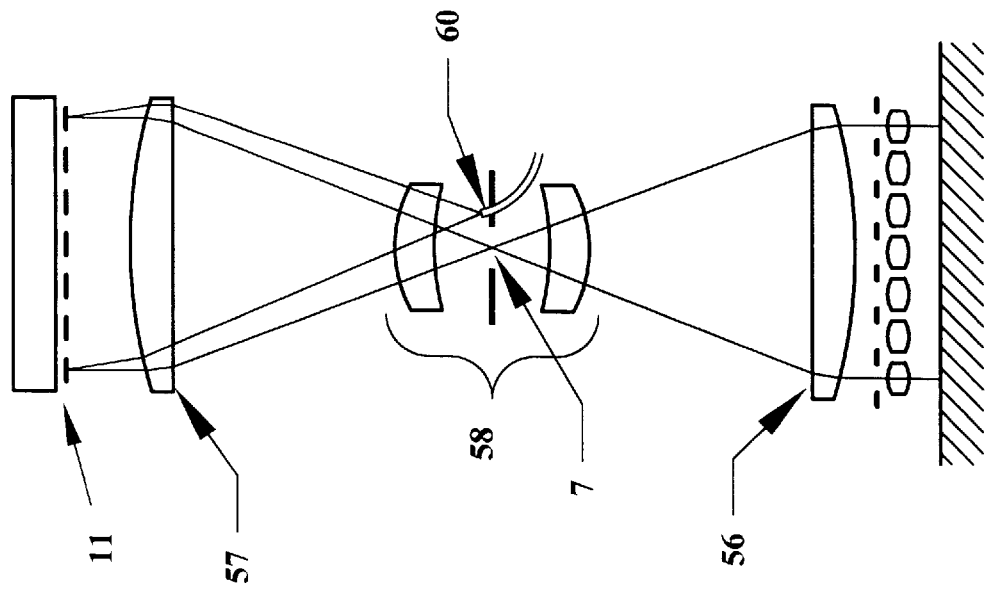
FIG. 19 illustrates an even simpler illumination system.

An even simpler illumination system is illustrated in FIG. 19. Rather than using a beam splitter, the illumination is brought into the system by means of a small, off-axis source such as an optical fiber 60 adjacent to the projection aperture 7. (An optical corrector element such as a binary optic element might be incorporated in front of the fiber to balance off-axis aberrations.) The image source 11 must be designed to work with off-axis illumination in this configuration.

Figure 20:
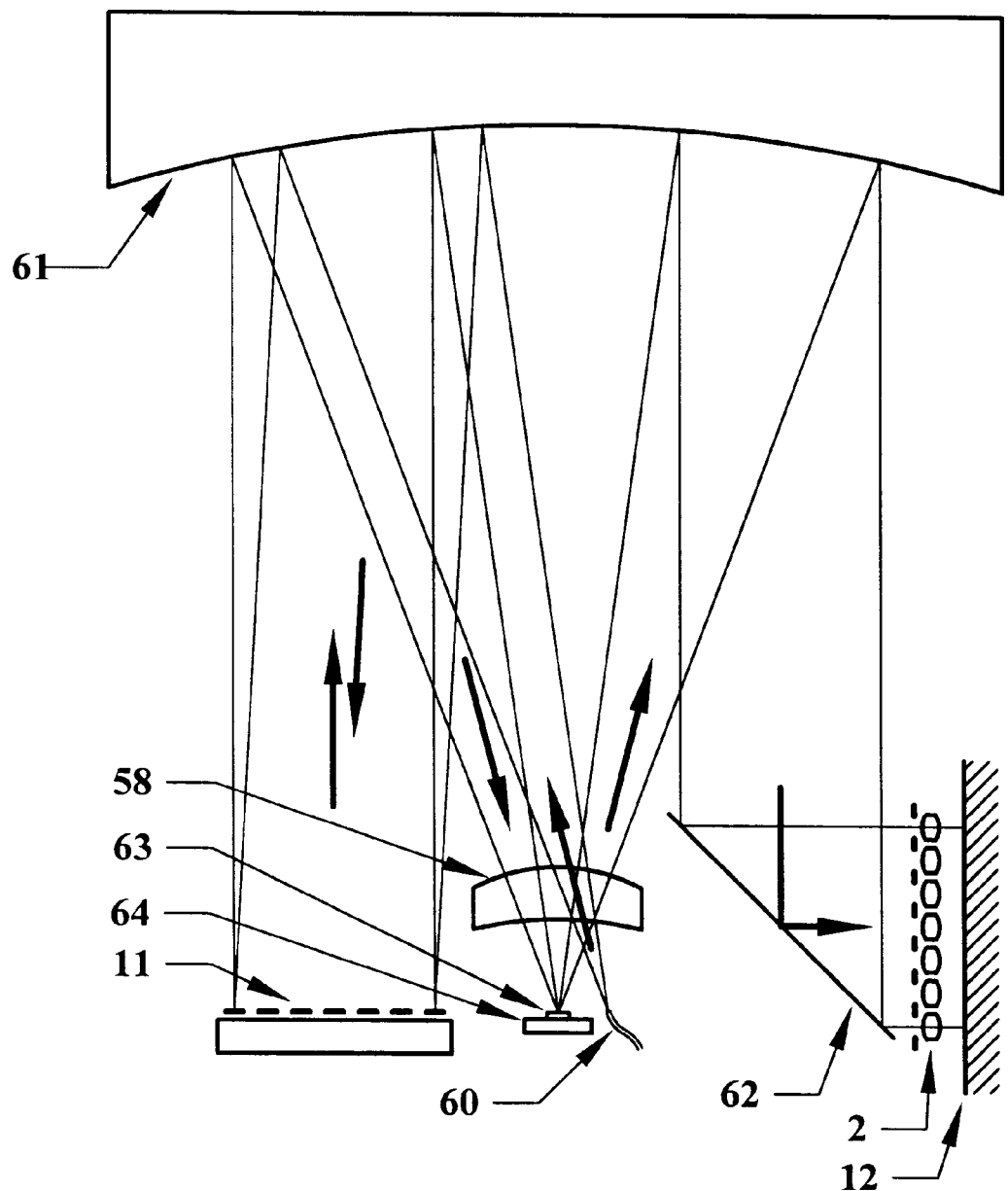
FIG. 20 illustrates a variant of the FIG. 19 configuration in which the two collimator lenses are replaced by a single collimating mirror.

FIG. 20 illustrates a variant of the FIG. 19 configuration in which the two collimator lenses 56 and 57 are replaced by a single collimating mirror 61. A fold mirror 62 may be used to physically separate the microlens array 2 and wafer 12 from the projection optics. The projection aperture is a reflective element (e.g., a small, square reflective pad 63 deposited on a low-reflectance substrate 64) and the aperture lens 58 operates bi-directionally. An advantage of this configuration is that it would exhibit very little chromatic aberration and could hence be used with a fairly broadband (e.g., 10 nm bandwidth) illumination source. (The optical geometry can be designed so that the aperture lens 58 has essentially no power and functions only as an aberration-controlling element; hence its chromatic dispersion will be very small. Although the microlenses are high-NA refractive elements, their imaging performance is not much affected by chromatic dispersion because of their small size.)

Figure 21A:
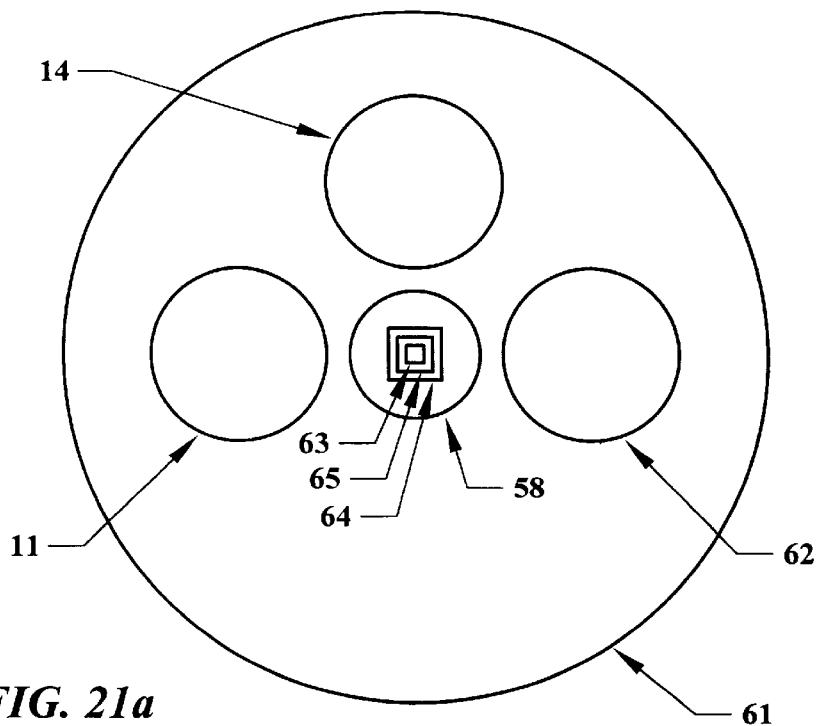
FIGS. 21a,b illustrate a configuration that is similar to FIG. 20, except that it includes a confocal viewing system which is used as a position encoder to monitor wafer alignment and focus.
Figure 21B:
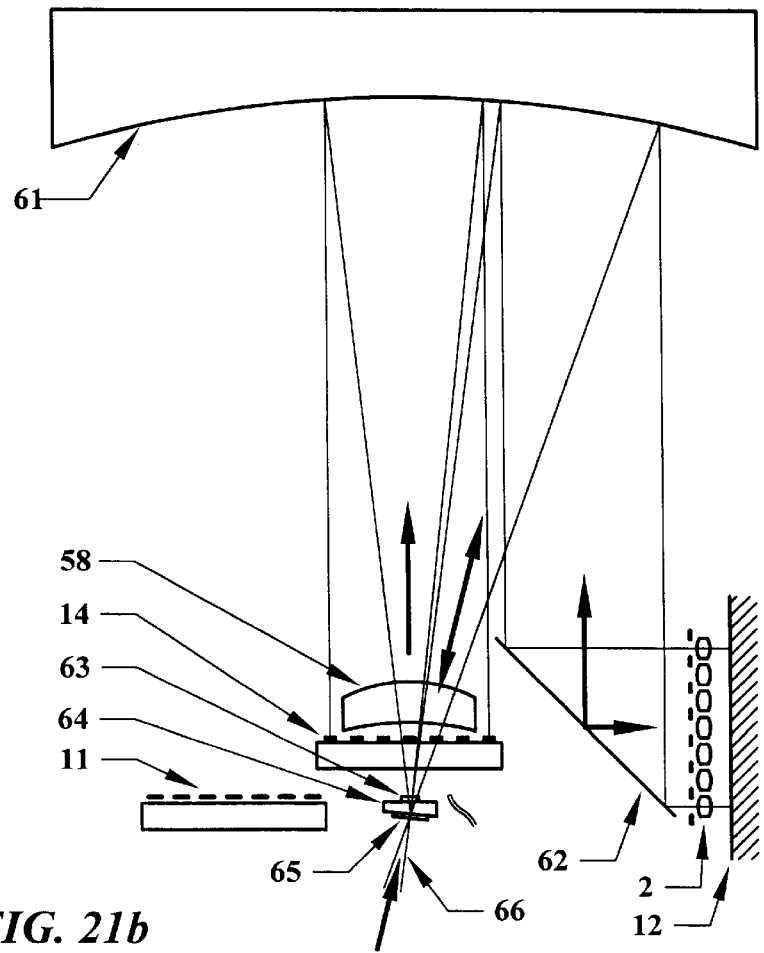

The configuration illustrated in FIGS. 21a,b is similar to FIG. 20, except that it includes a confocal viewing system which is used as a position encoder to monitor wafer alignment and focus. (This system is functionally similar to the FIG. 3 system.) The encoder system would use a long-wavelength light source such as a 633 nm HeNe laser which is outside of the sensitivity range of UV resists. The reflective pad 63 in this configuration (FIG. 21b) comprises an optical coating which is highly reflective at the UV exposure wavelength, but is transparent at the encoder wavelength, and the substrate 64 is transparent at both wavelengths. (The coating should also be designed so that transmitted light at the encoder wavelength does not exhibit a significant phase discontinuity across the coating boundary.) A second optical coating 65 which is formed on the substrate's bottom surface functions as a beam splitter at the encoder wavelength. The encoder's viewing illumination 66 is projected through both coatings and merged with the UV light path. It then reflects off of the collimator 61 and fold mirror 62, transmits through the microlens array 2, and is reflected back from the wafer 12. The return beam is partially reflected by the beamsplitter coating 65, it again reflects off the collimator 61, and is directed onto a detector array 14. Due to its longer wavelength, the encoder system's optimum aperture size would be larger than that of the UV exposure system (e.g., see Eq 27 and FIG. 14), so the beamsplitter coating 65 will have an aperture dimension larger than that of the UV-reflective pad 63. The bottom surface of the substrate 64 is cut at a compound wedge angle so that the beam reflected from the bottom coating 65 is spatially separated from the UV beam reflected from the top coating 63.

FIG. 21a shows a top view of the system (as viewed through the collimator 61), illustrating the positional relationships between the fold mirror aperture 62, the image source 11, and the detector array 14. This represents only one possible configuration. The surface tilt on both the top and bottom of the substrate 64 can be independently chosen to position the apertures 62, 11, and 14 in any preferred arrangement within the area defined by the collimator aperture 61. Also, the two reflective films could just as well be placed on the opposite sides of the substrate (i.e. with the UV-reflective film 63 on the bottom and the beam splitter coating 65 on top), although in this case the beam splitter coating would also have to be UV-transparent.

The Image Source

The Digital Micromirror Device (DMD, Ref. 3) has several favorable characteristics as an image source for microlithography: A digitally programmable image source would eliminate the need for lithography masks; the DMD's high frame rate (e.g., 10 kHz) should be sufficient to meet the throughput requirements for semiconductor production; and its pixel size (17 $\mu$m center spacing) is small enough to allow unit magnification in the projection system.

Figure 22:
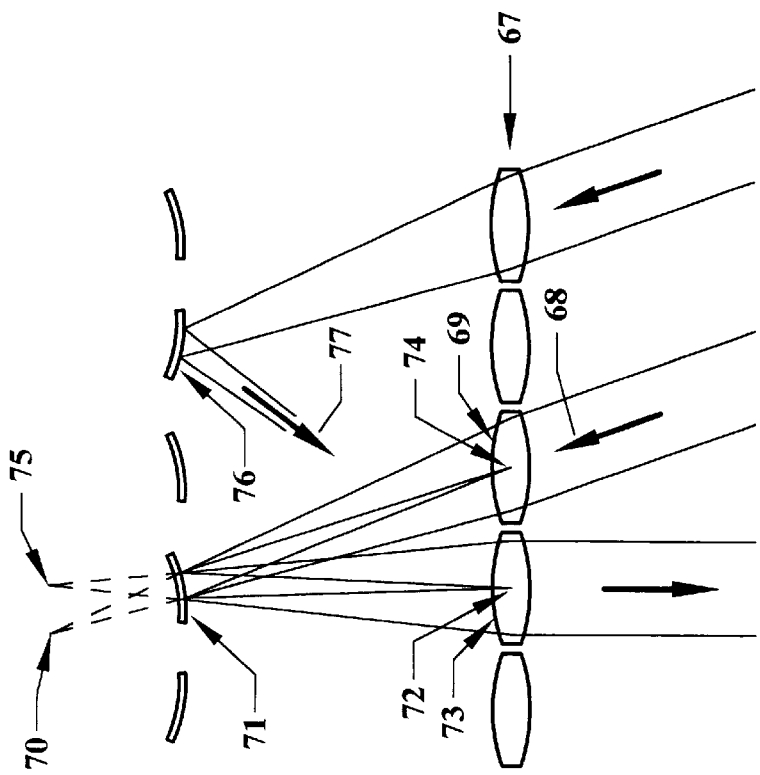
FIG. 22 illustrates a design configuration which uses an object-plane microlens array in conjunction with a micromirror array.

A couple of tradeoffs must be properly balanced in the design of a DMD system. These tradeoffs relate to the micromirrors' aperture size requirement and surface form tolerance, the micromirror tilt range and tilt tolerance, energy efficiency, and image cross-talk. FIG. 22 illustrates a design configuration for the image source which uses an object-plane microlens array in conjunction with the micromirror array to optimally balance these factors. An off-axis illumination beam (such as that produced by the fiber illuminator 60 in FIG. 19) is focused by microlens array 67 to an array of points; e.g. the portion of the illumination beam 68 intercepting microlens 69 is focused to point 70. Each focused beam is intercepted by a micromirror which is tilted (when in its "on" state) to reimage the focus point to a diffraction-limited spot at the center of a microlens aperture adjacent to the focusing microlens; e.g. micromirror 71 reimages point 70 to a point 72 at the center of microlens 73 adjacent to microlens 69, and the projection optics then reimages point 72 onto the center of a corresponding aperture of the image-plane microlens array. The micromirrors may contain some built-in optical power to facilitate this imaging function. For example, element 71 in FIG. 22 is illustrated as having some convex curvature. (Alternatively, the micromirrors could be formed as binary optic reflectors. The optical power could also be provided by microlenses formed on the micromirror surfaces, or by separate, stationary microlenses positioned close to the micromirror apertures.)

In addition to imaging the illumination source onto the microlens apertures, the micromirrors and microlenses also function to image the microlens apertures onto the projection aperture. For example, point 74 at the center of microlens aperture 69 is imaged by micromirror 71 to a virtual image point 75, which is then imaged by microlens 72 (in cooperation with the projection optics) onto the center of the projection aperture. (However, when the mirormirror is in its "off" position, as illustrated by element 76 in FIG. 22, it is tilted to divert the reflected beam 77 out of the projection aperture.)

A primary advantage of the above design configuration is that the uniform illumination over the object-plane microlens array 68 is effectively converted to an array of diffraction-limited point sources 72 in the reflected beam without incurring aperturing losses at the image source. This results in a controlled, even illumination distribution A" over the projection aperture and an image-plane distribution A' with minimal peak width (FIG. 14). The diffraction-limited size of the effective source points 72 is determined by the effective focal length of the microlens-micromirror combination (e.g. elements 69 and 71) and can be designed to optimize the tradeoff between image cross-talk suppression and energy efficiency. (Smaller source points will generally improve cross-talk suppression by reducing the width of the A' distribution, but will also result in a wider projection aperture distribution A' and consequent light loss due to overfilling of the aperture; see FIG. 14.)

Another advantage of the FIG. 22 configuration is that, by incorporating optical power in the micromirrors, the focal length of the object-plane microlenses can be reduced and the micromirrors can be positioned closer to the microlenses without incurring a wider spread of the projection aperture distribution A". This results in a more compact system and reduces the micromirror aperture size requirement (i.e. fill factor). (Even without incorporating optical power in the micromirrors, their apertures would only need to be half the size of the microlenses.) Furthermore, the surface figure tolerance and the micromirror tilt tolerance would also be relaxed, although these advantages would be balanced by an increased tilt range requirement and by the need to incorporate optical power in the microlenses.

The above design approach also has the advantage that it avoids the use of a beam splitter and the associated optical efficiency loss. Also, with the off-axis illumination arrangement there would be no need to tilt the projection system's object plane to accommodate the micromirror tilt.

Figure 23:
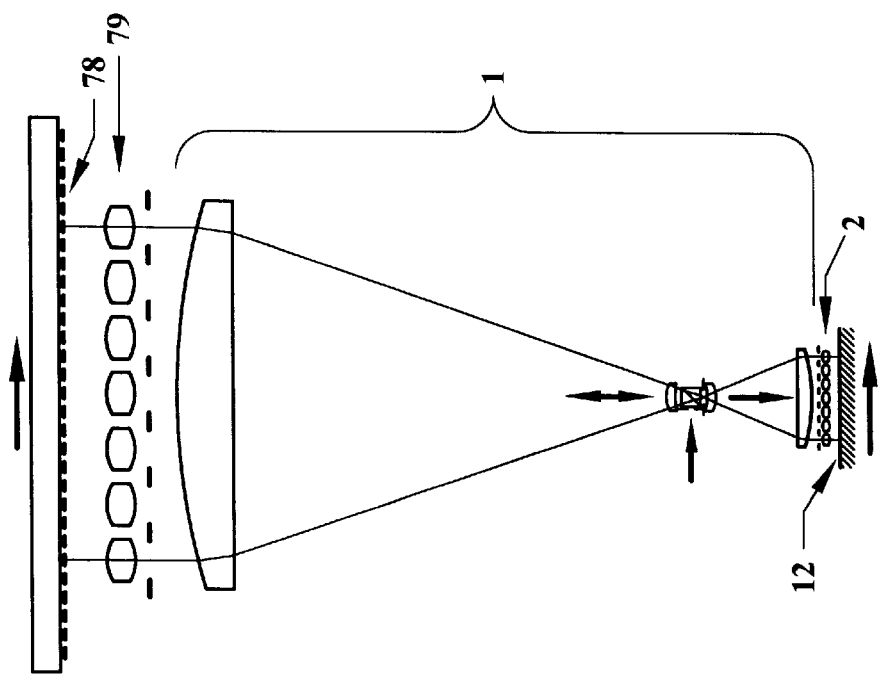
FIG. 23 illustrates an alternative embodiment which uses a photomask in conjunction with an object-plane microlens array.

The DMD is not the only option for the image source. One alternative, illustrated in FIG. 23, is to use a photomask 78 in conjunction with an object-plane microlens array 79. (The microlenses could be binary optic elements.) The projection system 1 images the array 79 onto the image-plane microlens array 2 at reduced magnification. A dense array of image pixel elements comprising small pads of differing reflectivity is formed on the photomask surface. At any point in time some of the pixels will be positioned at the object-plane microlens foci positions (i.e. conjugate to the projection aperture) and will be illuminated in reflection mode through the microlenses. The image source elements comprise the object-plane microlenses and corresponding illuminated pixels, and the elements are modulated by scanning the photomask across the focal point array to bring different pixels into position at the focal points. "On" pixels are represented by bright chrome pads, and "off" pixels comprise transparent or absorbing areas. (A choice of gray levels could be provided by forming high-frequency etched gratings on the chrome pads.) The wafer 12 and photomask 78 are both synchronously scanned and the illumination source is strobed so that exposures are made when the microlens focal points on the mask are centered on the pixels. (A technique for effectively strobing the illumination without actually modulating the light source is discussed below.) Thus, the photomask's reflectivity distribution will be mapped onto a corresponding exposure distribution on the wafer at reduced size.

With conventional chrome-on-quartz photomasks, transmitted-light illumination generally results in higher-quality imaging than reflected-light illumination because transmitted light interacts less with the chrome sidewalls. However, this would not be the case with the microlens system because edge-scattered light is substantially eliminated by the projection aperture. Also, the pixels would be significantly larger than the diffraction-limited microlens foci so there will not be much edge scatter. For example, with a 10× reduction system which is designed to produce a 0.1 μm microspot period on the wafer plane, the photomask pixel center spacing would be 1 μm, whereas the pixel illumination spots would have a diameter (full width at first diffraction nodes) of only about 0.5 μm (assuming deep UV illumination and a microlens NA of about 0.5). In addition to minimizing optical interactions with the chrome edges, the underfilled pixel apertures would provide some tolerance allowance for scanning synchronization error between the mask and the wafer.

If the image-plane microlenses are widely separated to suppress image cross-talk the photomask embodiment could incur severe optical losses because, unlike the DMD system (FIG. 22), the photomask system has no mechanism for concentrating the illumination within the object-plane microlenses. A good compromise between efficiency and cross-talk suppression can be achieved by using the "effective apodization" technique described above under "Aperture design": The object-plane microlens apertures and projection aperture are sized so that the first diffraction node of the amplitude distribution A" on the projection aperture (FIG. 14) is approximately at the projection aperture boundary; and the image-plane microlens apertures are sized so that the first diffraction node of the image-plane distribution A' is approximately at the microlens aperture boundary. This arrangement would tend to minimize the diffraction tails at the image plane and could allow the microlens apertures to be spaced fairly closely without incurring significant image cross-talk.

The compromise between efficiency versus cross-talk suppression could be circumvented by using the microlenses as extended-field imaging devices rather than using confocal-mode point imaging. In this mode the microlenses and projection aperture would be scaled up in size so that the image-plane microlens apertures and microspots are are both much larger than the diffraction limit. (As in the confocal imaging mode, however, the microspots would be at least an order of magnitude smaller than the microlens apertures, so this system retains the advantage that the microlenses need only operate over a small angular field.) Due to the larger microlens aperture dimensions, it could be feasible to illuminate the photomask with transmitted light rather than using reflected light, so the system could use conventional photomasks and could use standard image enchancement techniques such as phase-shifting and annular illumination. (The term "microlens" may be a misnomer in this context because the lens apertures could actually be quite large, e.g. several millimeters in diameter.) This system could have advantages over conventional, monolithic stepper designs (e.g. compact, low cost optics), although it would lack some of the principal advantages of confocal imaging (superior lateral resolution and depth discrimination, insensitivity to geometric and chromatic aberrations in the lens array, less susceptibility to optical coherence effects).

Other types of image source mechanisms could also be used with the microlens scanner. For example, a reflective film strip might be used instead of a photomask. Although most of the device embodiments considered above use reflected-light illumination, transmitted light could potentially also be used. The image source could, for example, be a film transparency or a liquid crystal device (LCD). However, reflective media have the advantage that the illumination can be focused down to an array of very small pixel elements by means of an object-plane microlens array in close proximity to the light-modulating elements (as in FIGS. 22 and 23). Furthermore, transparent media such as film transparencies do not generally transmit deep UV illumination efficiently.

The Illumination Source

The catadioptric system illustrated in FIG. 20 would exhibit very little chromatic aberration, so it could possibly be used with a fairly wide-bandwidth (e.g., 10 nm) illumination source such as a filtered arc lamp. This could be feasible for I-line (365 nm) processing, but for shorter wavelengths a deep UV laser source may be required to achieve sufficient exposure energy.

A pulsed laser such as a krypton fluoride (248 nm) or argon fluoride (193 nm) excimer laser could provide very high exposure energy. Line narrowing, which is required with conventional systems due to their high chromatic dispersion, would not be necessary with the catadioptric system. The pulse duration of an excimer laser is sufficiently short (e.g., 10 ns) that there would be no significant point smearing in the exposed image. The main drawback of excimer lasers is that their pulse repetition rate is typically less than 1 kHz, which is much less than the DMD's achievable frame rate and probably too slow for the high throughput requirements of semiconductor production. This limitation could only be overcome by either greatly increasing the number of pixels in the DMD or by having multiple microlens scanner systems operating in parallel. (A single laser could perhaps supply illumination to several scanner units.)

The frame rate would not be limited if a continuous illumination source such as an arc lamp is used. For deep-UV applications a continuous-wave, frequency-quadrupled Nd:YAG laser (266 nm) may be an attractive option (Ref. 6). One problem that could be encountered with a continuous source is the image point smearing due to the relative motion between the microlens array and the wafer. One way to reduce the smearing would be to effectively strobe the illumination by shuttering the light source, so that each image frame is exposed over a very brief time period. However this method would incur a very large loss in optical efficiency. Much of the loss could possibly be recovered by using the light source to supply several scanner units. (Rather than shuttering the light source, an optical switching mechanism would be used to sequentially cycle the illumination through several units.) However, in practice the illumination source may not have enough power to supply multiple units.

A practical solution of the point smearing problem would be to include a beam-scanning mechanism in the illumination optics which effectively strobes the beam by focusing the illumination to a narrow band, or a set of parallel bands, which are scanned at high speed across the image source. (Conceptually, this is analogous to the optical switching approach mentioned above, except that instead of switching the beam between different microlens scanner units it is effectively switched between different regions within a single unit.) This method is illustrated in FIGS. 24 and 25.

Figure 24:
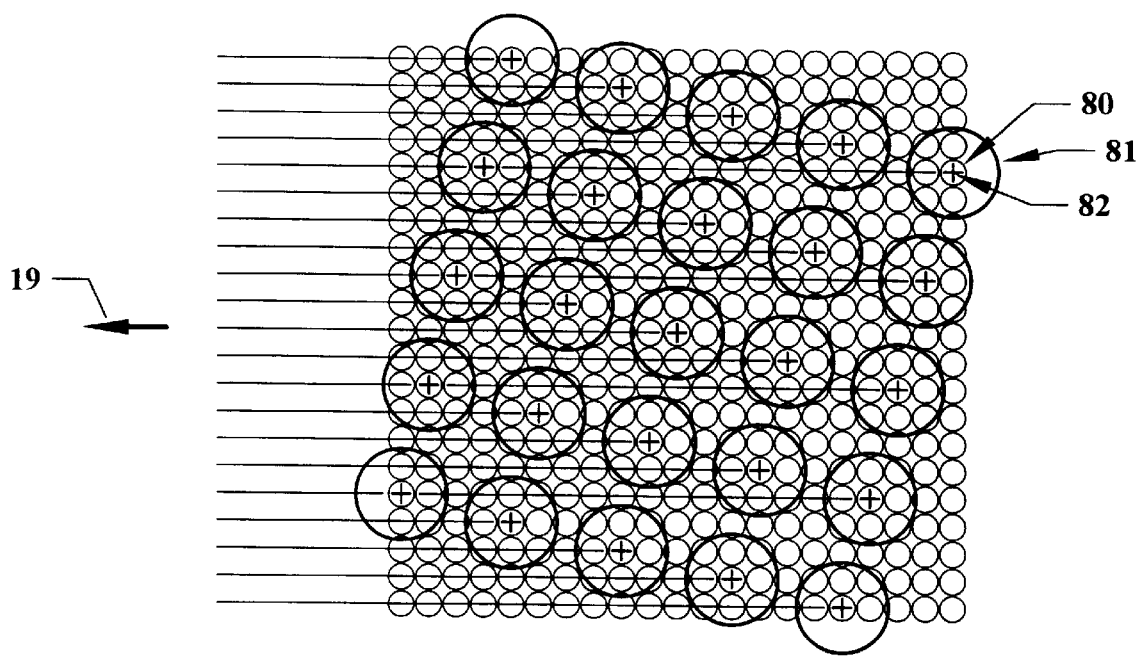
FIGS. 24 and 25 illustrate a scanned-illumination technique.

FIG. 24 shows how the microlenses are positioned relative to the wafer exposure pattern using conventional, full-field illumination with a pulsed light source. The small circles (e.g., 80) represent diffraction-limited microspots on the wafer, which are exposed at varying intensity levels to produce the raster image. The large circles 81 represent the microlens apertures, and the "+" marks 82 represent the positions of the microlens foci relative to the microspots at a particular instant in time. (In the context of the FIG. 23 system, FIG. 24 could alternatively be interpreted as representing the photomask 78, where the circles represent the reflective pads and the "+" marks represent the foci of the object-plane microlenses 79.) The wafer (or mask) is translated in the scan direction 19, and the light source is pulsed when the foci are centered over the microspots.

Figure 25:
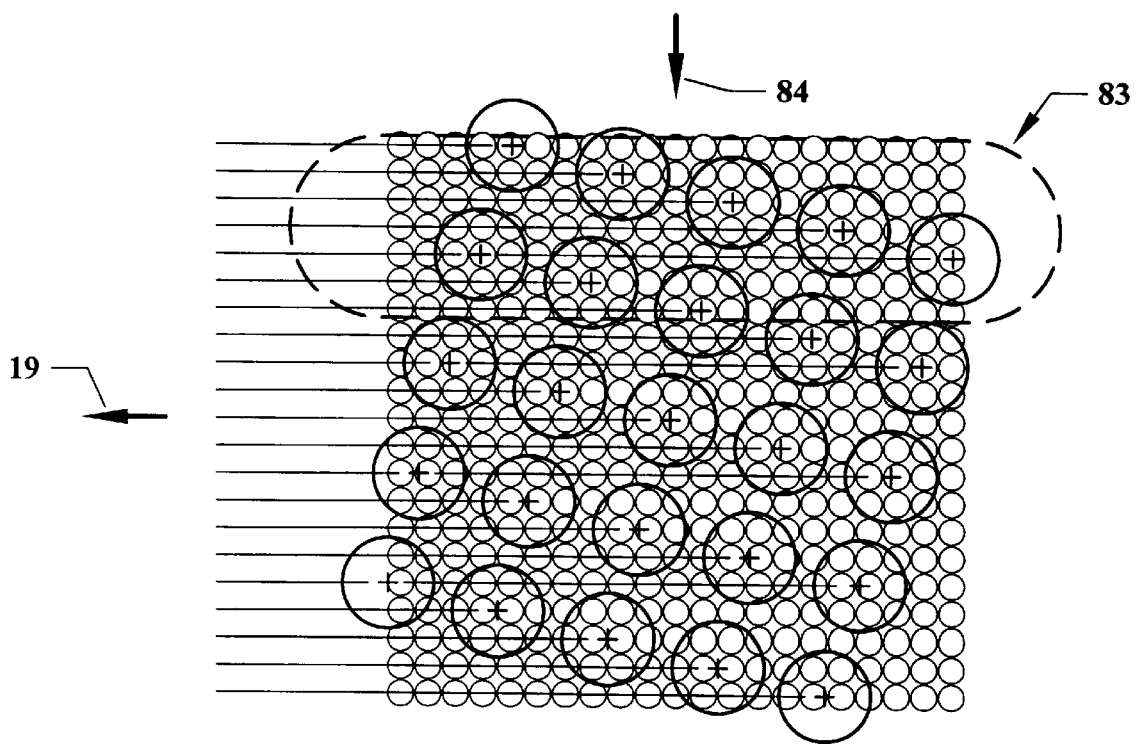

FIG. 25 illustrates the exposure geometry using the scanned-illumination technique. The illumination is confined to a narrow band 83 (or set of parallel bands) which is scanned across the object and image fields in a direction 84 transverse to the band (or bands). The beam is scanned synchronously with the wafer scan so that each microlens focus passes over the center of a microspot during the time that it is illuminated. (Note that in FIG. 25 the microlens foci outside of the illuminated area 83 are not centered on microspots, but the wafer scan will have shifted them to a centered position at the time they are traversed by the illumination beam.)

Positioning Feedback and Control

In the embodiments illustrated in FIGS. 3 and 21a,b the microlens array operates in conjunction with an optical detector array 14 as a position encoder which provides feedback to a closed-loop wafer positioning servomechanism. (A similar type of system could be used to control the photomask scanner in the FIG. 23 system.) The encoder data could include the wafer's lateral position (X and Y, where X is the scan coordinate and Y is the cross-scan coordinate), focus (Z), tilt (i.e., rotational displacements about the X and Y axes) and θ (rotation about the Z axis). In addition, the system could provide a measure of the surface warp distribution between the wafer and microlens array (i.e., Z as a function of X and Y). Typically, the position encoder would use a viewing wavelength different from the exposure wavelength, so the microlens array would need to include microlens elements that are specially designed for the encoder wavelength. (It may be possible, in principle, to design dual-wavelength microlenses. For example, a hybrid diffractive-refractive design could be used. However, the fabrication of such a design would be difficult and may entail performance compromises.) The encoder microlens elements could be formed as linear arrays bordering, or interspersed within, the two-dimensional array of exposure microlenses.

Figure 26:
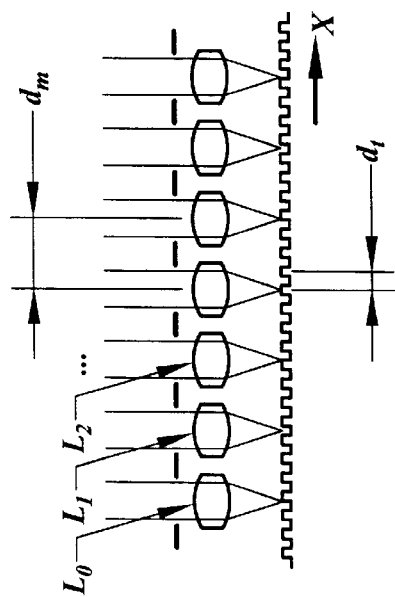
FIG. 26 illustrates the Moiré technique for X tracking.

X-Y position sensing could be achieved by using a Moiré technique in which the confocal response of a periodic pattern of microlenses is measured on a periodic tracking pattern. The technique is illustrated in FIG. 26 for X tracking. A periodic row of microlenses $L_0, L_1, L_2, \ldots$ with center spacing $d_m$ is positioned over a periodic tracking pattern (such as an etched, rectangular-profile relief grating) with period $d_t$. The tracking position can be specified in terms of a parameter $X_0$ which is defined to be the X position, in wafer-based coordinates, of lens $L_0$'s focus. ($X_0$ varies linearly with time.) The detector elements comprise light-sensing pixels, and the confocal response signal $S_n$ at the pixel corresponding to lens $L_n$, as a function of the tracking position $X_0$ and pixel number n, satisfies the periodicity relationship $$S_n[X_0] = S_0[X_0 + nd_m] \quad \text{Eq 36}$$

The function $S_0$ is periodic modulo $d_t$, $$S_0[X] = S_0[X \bmod d_t] \quad \text{Eq 37}$$

The dimensions $d_m$ and $d_t$ are chosen so that $d_m$ is close to, but not exactly equal to, an integer multiple of $d_t$, $$d_m = k\, d_t + \delta \quad \text{Eq 38}$$

where k is an integer and a is a small value (significantly smaller than $d_t$). Thus, $$S_n[X_0] = S_0[(X_0 + n(k\, d_t + \delta)) \bmod d_t] = S_0[X_0 + n\delta] \quad \text{Eq 39}$$

Figure 27:
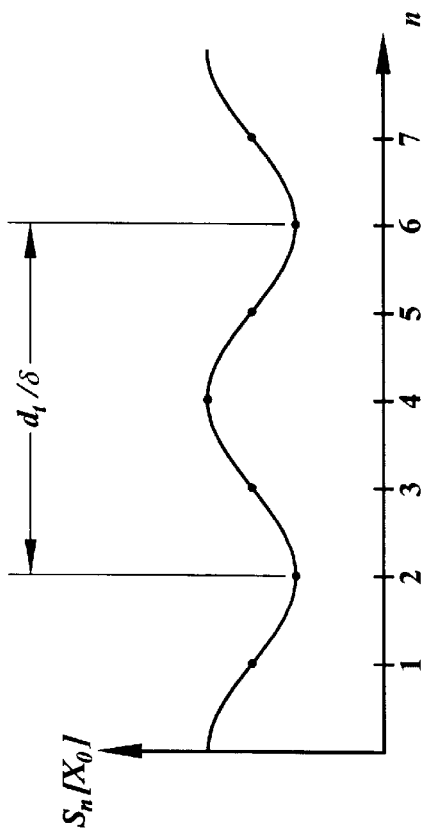
FIG. 27 illustrates the interpolated detector signal with the Moiré technique.

The signal profile will shift by 1 pixel as the wafer moves by a distance of δ, $$S_{n+1}[X_0] = S_0[X_0 + (n+1)\delta] = S_0[(X_0 + \delta) + n\delta] = S_n[X_0 + \delta] \quad \text{Eq 40}$$

hence the pixel-resolution confocal response can be used to measure $X_0$ with a resolution of δ. Better resolution can be achieved by interpolating the detector signal between pixels. The interpolated detector signal (as a function of fractional pixel number n) will be periodic modulo dt/δ, as illustrated in FIG. 27:

$$S_{(n+d_t/\delta)}[X_0] = S_0[X_0 + (n+d_t/\delta)\delta] = S_0[X_0 + n\delta] = S_n[X_0] \quad \text{Eq 41}$$

(from Eq's 39 and 37). The signal period $d_t/\delta$ is very large, so the detector signal's phase can be precisely measured to subpixel precision, resulting in a measurement precision of $X_0$ significantly better than δ.

Figure 28:
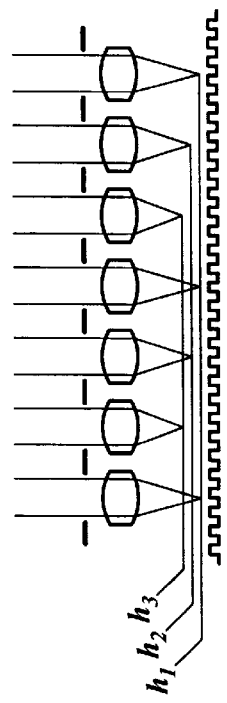
FIG. 28 illustrates three interspersed microlens sets with different focus heights, $h_1$, $h_2$, and $h_3$.

In practice several sets of position-sensor microlenses may be provided for focusing at different heights. For example, FIG. 28 illustrates three interspersed microlens sets with different focus heights, $h_1$, $h_2$, and $h_3$. The microlenses may also be spherically corrected for focusing through different thicknesses of resist.

Figure 29:
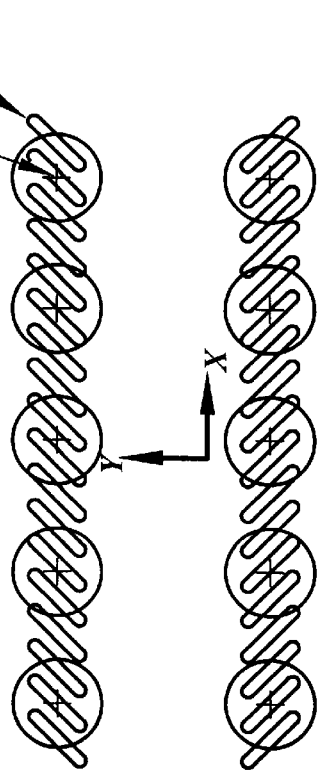
FIG. 29 illustrates a top view (looking down on the wafer plane) of a pattern that could be used for tracking X, Y, and $\theta$ rotation.

FIG. 29 illustrates a top view (looking down on the wafer plane) of a pattern that could be used for tracking X, Y, and θ rotation. Two parallel tracks are formed in the wafer scribe lines, each comprising parallel, etched wells 85 at 45° to the X-Y axes. The wells in one track are perpendicular to those of the other. A row of microlenses is disposed above each track. The microlens foci positions at a particular instant in time are indicated in FIG. 29 by "+" marks 86. (The cross-sectional geometry in an X-Z plane through either microlens row has the form described above and illustrated in FIG. 26 or 28.) Defining $(X_0, Y_0)$ to be the wafer-based coordinates at one particular focus, the phase of the signal profile from each microlens row will be a function of both $X_0$ and $Y_0$, with one of the phase terms being proportional to $X_0+Y_0$ and the other proportional to $X_0-Y_0$. The sum of the two phase terms provides a measure of $X_0$, and the difference provides a measure of $Y_0$. Furthermore, any slight θ rotation will result in a measurable shift in the fundamental frequencies of the two signal profiles. One frequency will increase with θ, whereas the other will decrease, so the difference between the two frequencies can provide an accurate measure of θ. The sum of the two frequencies could also be monitored to detect any thermal expansion mismatch between the microlens array and the wafer. The tracking signal could be analyzed digitally, or analog electronics could be used to convert the tracking signal to a positioning control signal. The position feedback would be insensitive to minor defects or random inaccuracies in either the microlenses or the tracking pattern because the position measurement uses data from a large number of microlenses (e.g., 1000).

If the wafer stage has an encoder that is sufficiently accurate and precise, a much simpler tracking method could be used in which position feedback is simply provided by the stage encoder itself, rather than by the microlens encoder. However, it would still be necessary to accurately locate and align the wafer relative to the microlens array, and microlens imaging could be used for pre-exposure alignment. The alignment pattern could include large features for coarse positioning (e.g., a Gray-code bar pattern), plus a simple periodic line/space or checkerboard pattern to provide high-resolution X and Y measurement by the Moiré technique outlined above (FIGS. 26, 27). At least two sets of alignment patterns would be formed at widely-separated locations on the wafer to get good θ measurement accuracy.

Other X-Y alignment techniques are also possible. Rather than using the microlens array as a position-sensing element, a Moiré diffraction grating could be used (Ref. 10). Also, optical position encoder elements such as microlens arrays or Moiré diffraction gratings could be set directly into the wafer stage, and the alignment patterns could be formed on the wafer's back side. Several advantages of this approach are that the alignment patterns would not take up valuable wafer space, they would not be affected by the wafer processing steps, and the close optical coupling between stage-embedded encoder elements and the wafer could help to improve alignment accuracy. A primary drawback of back-side alignment (and of top-side alignment using a Moiré grating) is s that it does not provide a direct measure of the wafer position relative to the microlens array, so alignment would require accurate calibration of the X-Y offset between the array and the position encoders. (This disadvantage could perhaps be mitigated by performing all fabrication steps on each wafer using the same exposure tool. The positioning error related to the X-Y offset would then be the same on all process layers, and hence will not affect overlay accuracy.)

The wafer stage encoder may be capable of providing a sufficiently accurate and precise position feedback signal, but whether or not the system relies on the stage encoder as the primary positioning feedback sensor, the stage drive mechanism itself may not be able to provide adequately precise and responsive position control. High-inertia stage motors could provide smooth, uniform scanning motion with positioning accuracies at the submicron level, but to achieve alignment accuracies below the 0.1 $\mu$m level while scanning the image at a frame rate of about 10 kHz additional alignment means may also be required.

Two supplementary fine-alignment mechanisms could be used, either alone or together. One would be a very precise X-Y position transducer, such as a piezoelectric actuator, coupled directly to the microlens array. If the microlens apertures are overfilled, slight lateral shifts in the microlens positions will simply cause their focal points to shift laterally without significantly affecting the focused spot intensity distribution. This mechanism would have a fast response time due to the microlens array's low inertia, but it would typically require an actuator with a resolution much better than 0.1 $\mu$m. (If the microlens array does not itself function as the primary position feedback sensor, an additional X-Y position encoder would also have to be incorporated in the microlens system as part of the fine-alignment mechanism.) In the FIG. 23 embodiment this technique could also be used for X-Y fine alignment between the photomask 78 and object-plane microlens array 79.

The second approach is to put an X-Y position actuator on the projection aperture. The focused spots on the wafer are diffraction-limited images of the projection aperture, so as long as the aperture is sufficiently overfilled a translational shift of the aperture will induce a corresponding positional shift of the spots. The illumination optics could include a beam-steering mechanism which operates in synchronization with the aperture actuator to keep the illumination energy centered on the aperture. An advantage of this approach is that large positional adjustments of the aperture will translate to exceptionally fine-resolution shifts in the focused spot positions (e.g., a 1 mm aperture shift might typically induce an image shift well below 0.1 $\mu$m). Note that in the system configuration shown in FIGS. 21$a$,$b$ the UV exposure projection aperture and the viewing projection aperture are both formed on a common substrate 64, so if the substrate position is adjusted for fine-alignment control the detector's X-Y feedback signal will always represent the wafer's relative position with the alignment correction applied. (This type of system would provide closed-loop alignment control. An alternative, open-loop design could be configured by depositing the UV aperture film 63 on a separate, movable substrate, while the viewing aperture film 65 remains fixed, so that the detector signal represents the relative wafer position before the fine-alignment correction is applied.)

The X alignment could also be fine-adjusted by synchronizing the image frame switching to the X encoder signal. For example, if the illumination source is an excimer laser its pulse switching could be triggered off of the encoder signal. Alternatively, if a DMD image source is used with a continuous light source, the frame rate could be synchronized to X by putting a variable time delay into the pixel switching or by phase-locking the DMD's clock signal to the encoder signal.

Figure 30:
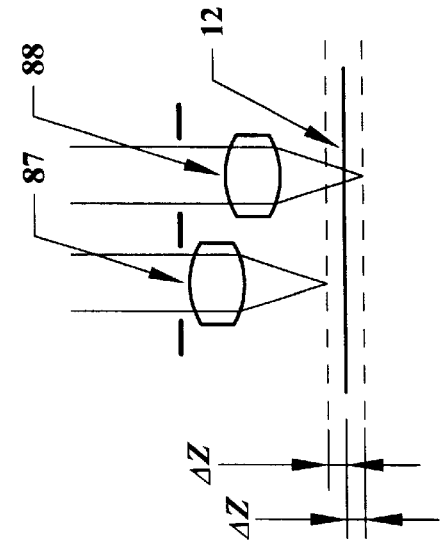
FIG. 30 illustrates the confocal response of a 0.5NA system operating at wavelength $\lambda=0.633$ $\mu$m.

In addition to functioning as a positioning encoder for X-Y tracking or alignment, the microlens array could also function to measure focus error. The normalized confocal focus response I[Z] of each microlens, as a function of focus position Z, has the form $$I[Z] = \text{sin } c^2[(4Z/\lambda) \sin^2[\alpha/2]] \qquad \text{Eq 42}$$

where $\lambda$ is the wavelength, sin [$\alpha$] is the microlens numerical aperture, and sin c[u]=sin [$\pi$u]/($\pi$u) (Ref. 1; Eq 1.1 on p. 11). For example, FIG. 30 illustrates the confocal response of a 0.5NA system operating at wavelength $\lambda$=0.633 $\mu$m. The curve's full width at half max is 2.1 $\mu$m. A very accurate measure of focus error can be obtained by comparing the signal responses of two adjacent microlenses which have a slight relative offset in their focus curves. The offset could be designed into the microlenses; for example, FIG. 31 illustrates two focus-sensor microlenses 87 and 88 with their focal planes displaced respectively above and below the wafer surface 12 by a distance $\Delta$Z.

Figure 32:
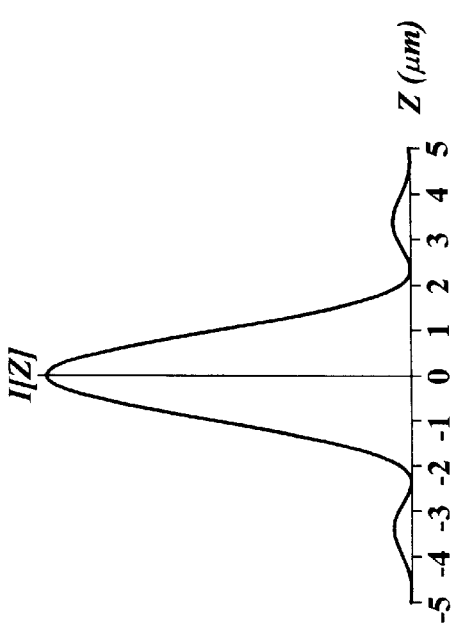
FIG. 32 illustrates a configuration in which the focus-sensor microlenses are designed to have a common focal plane displaced by a small distance $\Delta Z$ below the wafer surface, and portions of the wafer surface (e.g., areas within the scribe lines) are etched to a depth of $2\Delta Z$.

A focus offset could also be created by positioning two parfocal microlenses over areas on the wafer with different etch depths. For example, FIG. 32 illustrates a configuration in which the focus-sensor microlenses 87 and 88 are designed to have a common focal plane displaced by a small distance $\Delta$Z below the wafer surface, and portions of the wafer surface 12 (e.g., areas within the scribe lines) are etched to a depth of 2$\Delta$Z. (Since the microlenses' focal lengths naturally tend to be greater at long wavelengths due to chromatic dispersion, this approach has the potential advantage that special-purpose focus-sensor lenses may not be required. The same lens set could be used to both focus the UV exposure points onto the top surface and focus 0.633 $\mu$m radiation below the top surface.) Using either approach (FIG. 31 or FIG. 32), one of the microlenses will have a confocal response I[Z+$\Delta$Z] while the other's response will be I[Z-$\Delta$Z]. The two response functions can be combined to obtain a self-normalized focus feedback signal F[Z] of the form $$F[Z] = \frac{I[Z+\Delta Z] - I[Z-\Delta Z]}{I[Z+\Delta Z] + I[Z-\Delta Z]} \qquad \text{Eq 43}$$

Figure 33:
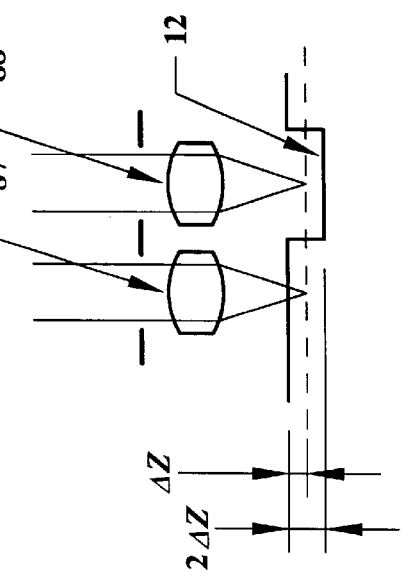
FIG. 33 illustrates the focus feedback signal F[Z] for a 0.5NA system operating at wavelength $\lambda=0.633$ $\mu$m, with $\Delta Z=0.5$ $\mu$m.

This function is illustrated in FIG. 33 for a 0.5NA system operating at wavelength $\lambda=0.633$ μm, with $\Delta Z=0.54$ μm. Within a +/−1.5 μm range the function is monotonic and varies approximately linearly with focus position.

Figure 31:
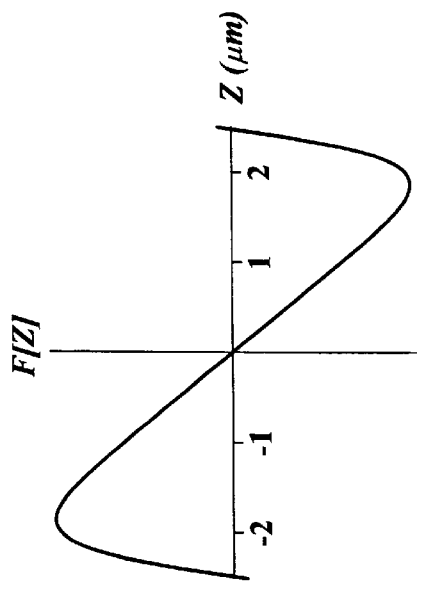
FIG. 31 illustrates two focus-sensor microlenses with their focal planes displaced respectively above and below the wafer surface by a distance $\Delta Z$.

Generalizing on the concept illustrated in FIG. 31, three or more microlens sets covering a range of focal heights could be used to provide fine-focus capability over a large range of focus positions. (Or extending the FIG. 32 concept, three or more etch depths could be provided for extended-range focusing with parfocal microlenses.) Long focal length, low-NA microlenses could be used to provide coarse focusing over an even greater range, though the long-range focus elements would not have as good precision. (The focus range and precision error both vary in proportion to $1/NA^2$.)

In addition to measuring focus position, the relative tilt between the wafer and the microlens array can be measured by combining the output from three or more Z position encoders distributed at widely-separated positions on the array. A complete Z-height mapping over the array can also be made by combining the output from a large number of Z sensors. This data could be used to measure warp distortion.

Figure 34:
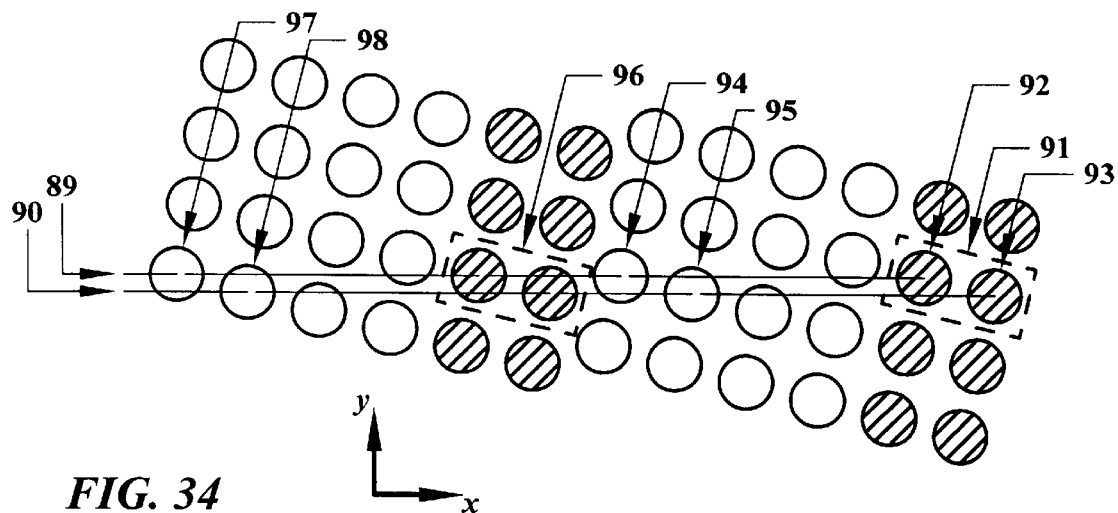
FIG. 34 illustrates a microlens layout with interspersed Z sensors.

One approach to warp measurement would be to use a row of Z sensors along the microlens array's leading edge to map out the wafer's warp distribution in raster fashion as the wafer is scanned under the array. However, this method would not provide information on the array's own intrinsic warp, which would have to be separately calibrated and added to the wafer warp get the cumulative warp distortion. The array's warp could be calibrated by measuring the exposure microlenses' confocal response on an optical flat (with UV illumination) over a range of focus heights. A simpler and more robust method for measuring warp might be to use several rows of Z sensor elements parallel to the leading-edge row and interspersed within the array. A microlens layout with interspersed Z sensors is illustrated in FIG. 34. This is similar to the multiscan layout in FIG. 6, except that Z sensor lenses (illustrated as the hatched circles) are interspersed along the scan lines. For example, adjacent scan lines 89 and 90 are covered by a Z sensor unit 91 comprising two or more microlenses 92 and 93 at the array's leading edge. These elements are designed for operation at the encoder viewing wavelength and have a built-in focus offset as in FIG. 31. (Ideally elements 92 and 93 would cover the same scan line, but they have a slight Y displacement in FIG. 34 so that the microlenses can be laid out in a square array.) This unit is followed by UV exposure lenses 94 and 95, a second Z sensor unit 96 and exposure lenses 97 and 98, etc. (in FIG. 34 one third of the lenses are shown as Z sensor elements, but in practice the ratio might be closer to 1% or less.)

The measured warp-induced focus error could be dynamically corrected by inducing a compensating warp distribution in the array. The corrective warp is generated by applying a stress distribution along the microlens array's periphery (e.g., by means of piezoelectric transducers). A very general warp distribution can be induced by this method. Over the array's interior there are no normal forces and the induced Z displacement $\delta Z[X, Y]$, as a function of transverse coordinates X and Y, is described by the general thin-plate equilibrium equation, $$\frac{\partial^4 \delta Z}{\partial X^4} + 2\frac{\partial^4 \delta Z}{\partial X^2 \partial Y^2} + \frac{\partial^4 \delta Z}{\partial Y^4} = 0 \qquad \text{Eq 44}$$

(from Ref. 11, Eq. 13.41 on p. 727). The solution of this equation is determined by the boundary values of $\delta Z$ and its gradient; hence by controlling the surface height and gradient at the array periphery any warp distribution satisfying the above equation can, in principle, be generated. For example, a warp distribution having the form of a general third-order polynomial in X and Y could be induced.

The above technique could be implemented in practice as follows. Assume that there are Z sensors distributed within the microlens array's interior which provide focus height measurements $Z_1, Z_2, \ldots$ relative to the wafer surface. Stress actuators, which are distributed around the array's periphery, are controlled by voltages $V_1, V_2, \ldots$ Variations $\delta V_1, \delta V_2, \ldots$ in the applied voltages will induce small focus height displacements $\delta V_1, \delta Z_2, \ldots$ which have an approximately linear dependence on the voltages, $$\delta Z_i = \sum_j C_{ij} \delta V_j \qquad \text{Eq 45}$$

The $C_{ij}$'s are constant calibration coefficients which can be determined by focusing on an optical flat and measuring the induced warp distribution as various voltage combinations are applied. Eq 45 can be expressed in matrix notation as $$\delta Z = C \delta V \qquad \text{Eq 46}$$

In the microlens array's operational mode, the focus heights $Z_1, Z_2, \ldots$ are dynamically measured and subtracted from the design focus height (with compensation for any designed-in wafer topography) to obtain the computed height corrections $\delta Z_1, \delta Z_2, \ldots$ Eq 46 can then be used to calculate the control voltage adjustments that will induce the computed correction. Eq 46 cannot generally be solved exactly because there may typically be many more Z sensors than actuators, but the equation can be solved approximately by least-squares minimization:

$$\delta V = (C^T C)^{-1} C^T \delta Z \qquad \text{Eq 47}$$

where $C^T$ is the matrix transpose of C. With some modification to provide damping of feedback oscillations, Eq 47 could serve as the basis of an algorithm to provide closed-loop control of fine focus, tilt, and warp compensation.

Figure 35A:
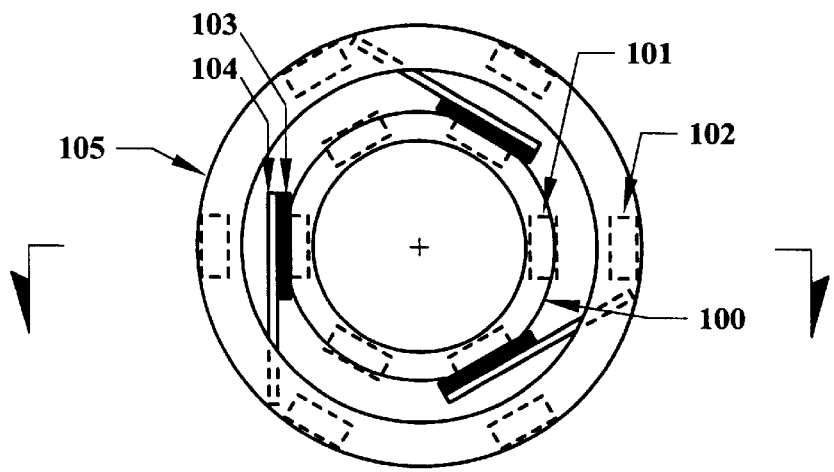
FIGS. 35a,b are top and sectional side views of a system which provides six-axis micropositioning control of the microlens array, plus warp compensation.
Figure 35B:
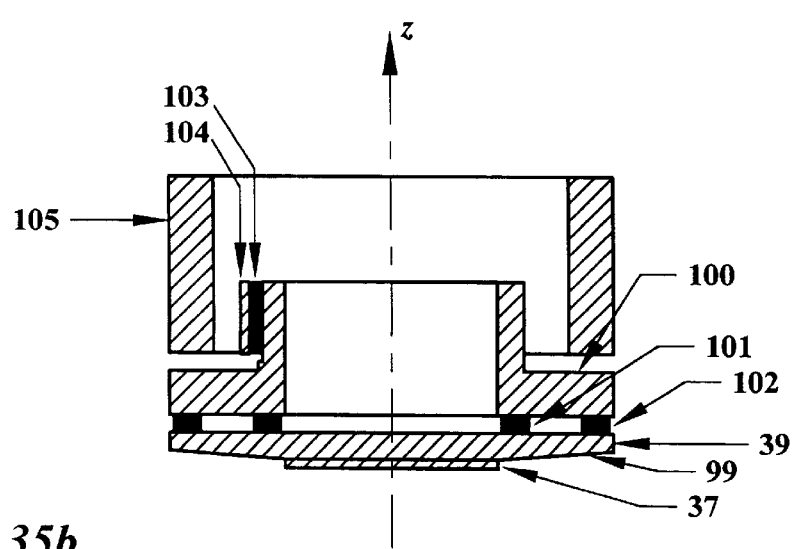

FIGS. 35a,b are top and sectional side views of a system which provides six-axis micropositioning control of the microlens array, plus warp compensation. The microlenses are formed as an etched surface relief pattern on a very thin fused silica disk 37 (see FIG. 15) which is bonded to a supporting fused silica superstrate 39. The superstrate is disk-shaped and is thin enough to have some flexibility, and its bottom surface has a slight, shallow bevel 99 around its periphery to ensure wafer clearance as the disk is flexed. It is attached to a rigid, flanged tubular element 100 by means of vertically poled piezoelectric pads (e.g., 101 and 102) which control the Z height distribution over the superstrate's periphery. The pads are distributed in a circumferential arrangement of paired elements, wherein the elements of each pair (e.g., elements 101 and 102) are radially displaced so that they can act in opposition (e.g., one contracting, the other expanding) to control the superstrate's surface gradient at its periphery.

The outer surface of tubular element 100 has three flats on which piezoelectric shear plates (e.g., 103) are bonded. The outer surface of each plate is bonded to a leaf spring (e.g., 104) which is attached to a supporting outer tube 105. Each piezoelectric plate is poled horizontally, parallel to the attached leaf spring, so the three plates can be actuated to provide X, Y, and θ micropositioning control. The outer tube 105 could be housed in a conventional microscope focus mechanism which is used for initial coarse-focus adjustment, but which would normally be locked during scan exposure operations.

Figure 36:
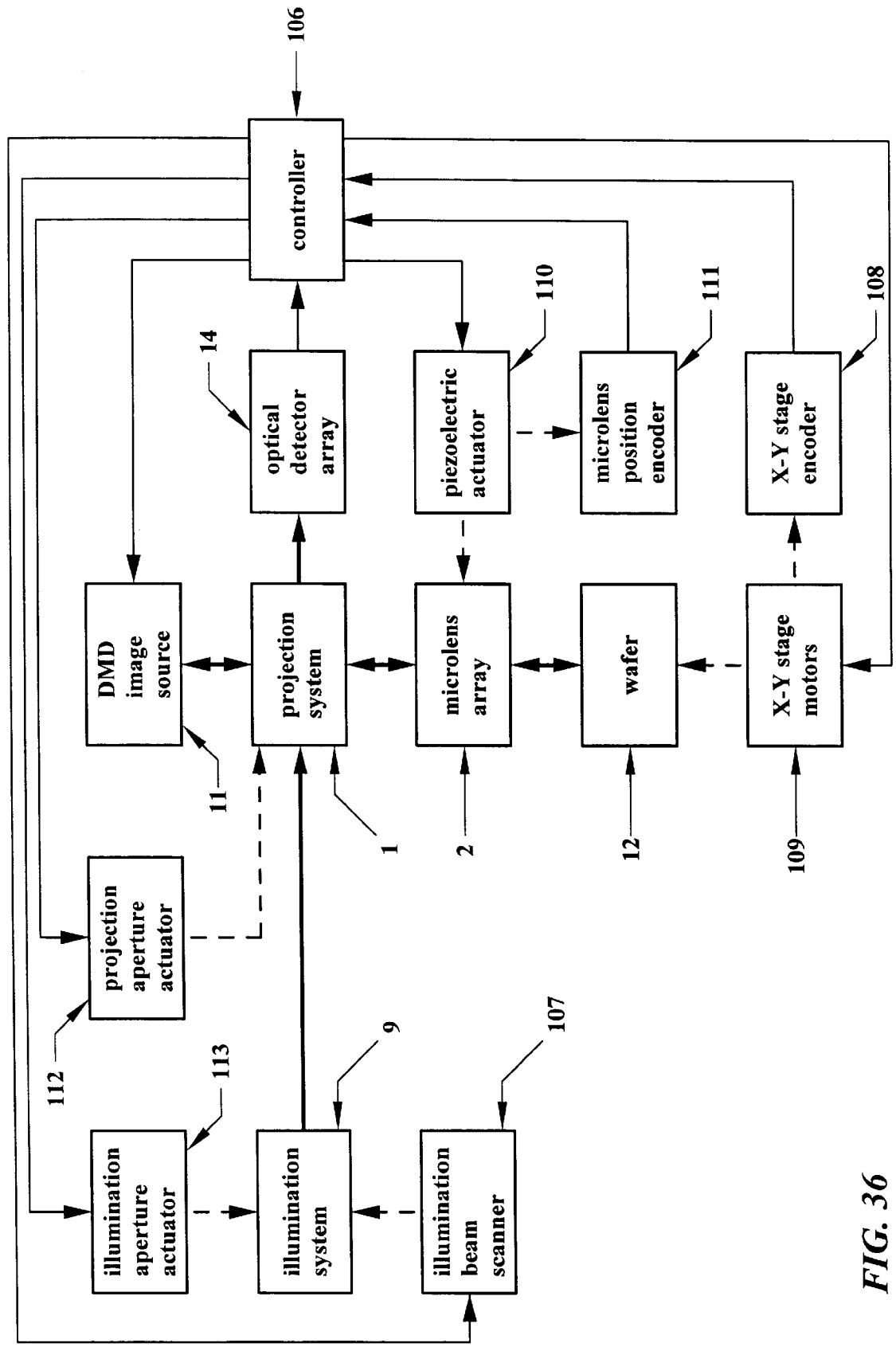
FIG. 36 shows a system-level schematic summarizing the various feedback and control mechanisms.

FIG. 36 shows a system-level schematic summarizing the various feedback and control mechanisms described above, in a preferred embodiment. (A practical microlithography exposure tool would not necessarily require all of the elements illustrated in FIG. 36.) Optical paths are indicated in the diagram by heavy, solid lines; electronic data or signal paths are represented as light, solid lines; and mechanical control linkages are represented as dashed lines. The "controller" 106 may comprise one or more computers, digital micro-controllers, analog circuits, or a combination of such elements. The controller synchronizes the wafer scan, the DMD image frame generation, and (optionally) an illumination beam scanner 107 (see FIG. 25); and it also controls a feedback loop which dynamically corrects scan positioning errors. The optical detector signal provides dynamic focus, tilt, and warp measurement during scanning, and also provides high-resolution X-Y and θ position data for pre-exposure alignment by the Moiré technique described above. The Moiré signal could possibly also be used for dynamic scan control, although it may be more practical to rely on the stage encoder 108 for fine X-Y scan position sensing. Coarse X-Y scan actuation would be provided by the stage motors 109, while high-resolution X-Y scan positioning, as well as focus, tilt, and warp correction, would be provided by a piezoelectric actuator 110 coupled to the microlens array. (The piezoelectric servomechanism would have its own position encoder 111.) Fine X-Y scan control could also optionally be provided by means of mechanical actuators 112 and 113 coupled to the projection and illumination apertures.

Notation for Derivation of Eq's 11 and 12

In the derivations below the following notational convenience will be used to represent a function f that takes arguments x, y, . . . :

$$(f[x, y, \ldots ]|x, y, \ldots )$$

(The above expression is read "the function that, when applied to arguments x, y, . . . , yields f[x, y, . . . ]".) Also, the Fourier transform of a function f will be denoted $$\Im[f] = (\int \ldots \int f[x, y, \ldots] \exp[i2\pi(xx'+yy'+\ldots)] \, dx \, dy \ldots |x', y', \ldots)$$

where $\Im$ can represent the one-dimensional Fourier transform, or the two-dimensional transform, etc., depending on how many arguments f takes. This is the "unitary" form of the Fourier transform, which has a $2\pi$ factor in the exponent. With this convention, the inverse transformation $\Im^{-1}$ has the form $$\Im^{-1}[f] = (\int \ldots \int f[x', y', \ldots] \exp[-i2\pi(xx'+yy'+\ldots)] dx' \, dy' \ldots |x, y, \ldots)$$

The convolution operator, conv, is defined by $$\text{conv}[f, g] = (\int \ldots \int f[x', y', \ldots] g[x-x', y-y', \ldots] dx' \, dy' \ldots |x, y, \ldots)$$

where this can represent the one-dimensional convolution, or the two-dimensional convolution, etc., depending on the type of f and g. We will also make use of the Dirac delta function δ, and the Dirac comb function, which is defined by $$\text{comb}[x] = \sum_{j=-\infty}^{\infty} \delta[x-j]$$

Derivation of the Plane Exposure Theorem (Eq 11)

Eq 11 can be derived by using the following equivalent form of Eq 9

$$E_{plane} = \text{conv}[|A|^2, (\text{comb}[x/s]\text{comb}[y/s]/s^2|x, y)] \qquad \text{Eq A1}$$

Taking the Fourier transform of both sides of Eq A1, applying the convolution theorem ($\Im[\text{conv}[f,g]] = \Im[f] \cdot \Im[g]$), and making use of the relation $\Im[\text{comb}] = \text{comb}$, we obtain $$\Im[E_{plane}] = \Im[|A|^2] \cdot (\text{comb}[x's] \, \text{comb}[y's]|x', y') \qquad \text{Eq A2}$$

Again applying the convolution theorem ($\Im[f \cdot g] = \text{conv}[\Im[f], \Im[g]]$), the first term on the right side of Eq A2 translates to $$\Im[|A|^2] = \text{conv}[A', (A'[-x', -y']^*|x', y')] \qquad \text{Eq A3}$$

The aperture function A'[x', y'] is zero everywhere outside of a square of half-width $NA_m$ centered at the origin, $$A'[x', y'] = 0 \text{ if } |x'| > NA_m \text{ or } |y'| > NA_m \qquad \text{Eq A4}$$

from which it follows that Eq A3 is zero outside a square of half-width $2\, NA_m$, $$\text{conv}[A', (A'[-x', -y']^*|x', y')][x', y'] = 0 \text{ if } |x'| > 2NA_m \text{ or } |y'| > 2NA_m \qquad \text{Eq A5}$$

But the comb term in Eq A2 consists of a superposition of delta functions located at points where x' and y' are integer multiples of 1/s, so under the assumption that $s < 1/(2\, NA_m)$ (Eq 10) all of these delta functions except the zero-order term at (x', y')=(0,0) will be masked by the aperture function:

$$\Im[E_{plane}] = \Im[|A|^2] \cdot (\delta[x's]\delta[y's]|x', y') \qquad \text{Eq A6}$$

Taking the inverse Fourier transform of both sides this expression, we obtain $$E_{plane} = \text{conv}[|A|^2, (1/s^2|x, y)] \qquad \text{Eq A7}$$

which is equivalent to Eq 11.

Derivation of the Line Exposure Theorem (Eq 12)

Eq 12 can be derived by using the following equivalent form of Eq 8:

$$(E_{line}[x, y]|y) = \text{conv}[(|A[x, y]||y), (\text{comb}[y/s]/s|y)] \qquad \text{Eq A8}$$

Taking the inverse Fourier transform of both sides of Eq A8 and applying the (1-dimensional) convolution theorem yields $$\Im[(E_{line}[x, y]|y)] = \Im[(|A[x, y]|^2|y)] \cdot (\text{comb}[y's]|y') \qquad \text{Eq A9}$$

Again applying the convolution theorem, the first term on the right side of Eq A9 translates to $$\Im[(|A[x, y]|^2|y)] = \text{conv}[\Im[(A[x, y]|y)], \Im[(A[x, -y]^*|y)]] \qquad \text{Eq A10}$$

The two-dimensional Fourier transform operation relating A to A' (Eq 3, $A' = \Im[A]$) is equivalent to the composition of two one-dimensional Fourier transforms applied sequentially to the x and y coordinates, $$A'[x', y'] = \Im[A][x', y'] = \Im[(\Im[(A[x, y]|y)][y'])|x)][x']$$   Eq A11

Hence, the Fourier transform of A[x, y] with respect to just the y variable is equivalent to the inverse transform of A'[x', y'] with respect to x', $$\Im[(A[x, y]|y)][y'] = \Im^{-1}[(A'[x', y']|x')][x]$$   Eq A12

Since A'[x', y']=0 for |y'|>NA$_m$ (Eq A4) it also follows that $$\Im^{-1}[(A'[x', y']|x')][x] = 0 \text{ for } |y'| > NA_m$$   Eq A13

Hence, from Eq A12 both arguments of the convolution operator in Eq A10 will be zero outside an interval of half-width NA, centered at zero, and therefore $$\text{conv}[\Im[(A[x, y]|y)], \Im[(A[x, -y]^*|y)]][y'] = 0 \text{ for } |y'| > 2 NA_m$$   Eq A14

Under the assumption that s<1/(2 NA$_m$) it follows from Eq A14 that all the delta functions constituting the comb term in Eq A9, except for the zero-order term, will be masked by the aperture function; hence Eq A9 is equivalent to $$\Im(E_{line}[x, y]|y) = \Im[(|A[x, y]|^2|y)] \cdot (\delta[y's]|y')$$   Eq A15

Taking the inverse Fourier transform of both sides of Eq A15, we obtain $$(E_{line}[x, y]|y) = \text{conv}[(|A[x, y]|^2|y), (1/s|y)]$$   Eq A16 which is equivalent to Eq 12.

Conclusion

In conclusion it can be seen that the present invention provides imaging systems and techniques for achieving high resolution and field size. Systems according to the invention can be readily manufactured using existing microlithographic and other optical technologies. The invention thus reduces the complexity and expense that characterize conventional wide-field, high-NA microscopy and microlithography systems. Furthermore, it provides potential performance advantages in that it makes possible flat field, distortion-free imaging, with accurate overlay, focus, and warp compensation, over very large image fields (larger than the practical limits of conventional imaging means). In one embodiment it would use a Digital Micromirror Device as the image source, potentially eliminating the need for photomasks in semiconductor manufacture.

While the above is a complete description of specific embodiments of the invention, various modifications, alternative constructions, and equivalents may be used. Therefore, the above description should not be taken as limiting the scope of the invention as defined by the claims.

References

Ref. 1: T. Wilson (Editor), *Confocal Microscopy*, Academic Press, San Diego (1990).

Ref. 2: D. J. Elliott, *Integrated Circuit Fabrication Technology* (2nd Ed.), McGraw-Hill, New York (1989).

Ref. 3: J. B. Sampsell, "An Overview of the Performance Envelope of Digital Micromirror Device (DMD) Based Projection Display Systems," *Society for Information Display* 1994 *International Symposium* (San Jose, Calif., Jun. 12–17, 1994).

Ref. 4: W. B. Hugle, *Lens Array Photolithography*, U.S. Pat. No. 5,517,279 (1996).

Ref. 5: R. Völkel et. al., "Microlens array imaging system for photolithography," Optical Engineering 35(11), 3323–3330 (1996).

Ref. 6: H. Suganuma et. al., "Deep UV lithography using continuous-wave 266 nm radiation from all solid-state frequency quadrupled Nd:YAG laser," *Proc. SPIE*, 2440, 126–135 (1995).

Ref. 7: E. J. Gratrix and C. B. Zarowin, "Fabrication of Microlenses by Laser Assisted Chemical Etching (LACE)," *Proc. SPIE*, 1544, 238–243 (1991).

Ref. 8: M. Eisner and J. Schwider, "Transferring resist microlenses into silicon by reactive ion etching," Optical Engineering 35(10), 2979–2982 (1996).

Ref. 9: M. Bass, ed., *Handbook of Optics*, $2^{nd}$ ed., vol. 2, McGraw-Hill, New York (1995).

Ref. 10: Y. C. Park and S. W. Kim, Method and Apparatus for Measuring Two Dimensional Plane Displacement by Moiré Fringes of Concentric Circle Gratings, U.S. Pat. No. 5,459,578 (1995).

Ref. 11: W. D. Pilkey and W. Wunderlich, *Mechanics of Structures: Variational and Computational Principles*, CRC Press, Boca Raton (1994).

What is claimed is:

1. A printing system comprising:
   an optical projection system having an object plane, an image plane which is conjugate to the object plane, and a limiting aperture stop which is referred to as the projection aperture;
   a planar array of microlenses having respective apertures defining a microlens aperture array, wherein the aperture array is positioned at the projection system's image plane, and wherein the microlenses have respective focal points which are conjugate to the projection aperture and which define a focal point array;
   a scanning mechanism which establishes relative motion between the the microlens array and a printing surface proximate the focal point array, wherein the paths traversed by the focal points relative to the printing surface comprise a set of closely-spaced raster lines;
   an image source comprising an array of light-modulating image source elements, wherein the image source is positioned at the projection system's object plane, and wherein the projection system images each image source element onto a corresponding microlens aperture and the image source element thus controls the light level over a microspot on the printing surface, proximate the corresponding microlens focal point; and
   an image modulation mechanism that controls the image source as the printing surface is scanned, whereby, when a photosensitive material is positioned in the printing surface, a synthesized, high-resolution raster image is recorded on the photosensitive material.

2. The printing system of claim 1 wherein the photosensitive material is photoresist on a planar substrate.

3. The printing system of claim 2 wherein the substrate is a semiconductor wafer.

4. The printing system of claim 1 wherein the projection aperture size and shape are determined so that the diffraction-limited amplitude distribution produced by each image source element on its corresponding microlens aperture has nodes on adjacent microlens apertures, whereby light leakage into adjacent microlenses is minimized.

5. The printing system of claim 1 wherein the projection aperture is apodized to minimize light leakage into adjacent microlens apertures.

6. The printing system of claim 1, further comprising an illumination system which illuminates the image source, wherein the illumination is modulated by the image source elements and is transmitted by the projection system and microlens array onto the printing surface.

7. The printing system of claim 6 wherein:
the scanning mechanism of claim 1 defines a first scanning mechanism, and the illumination system further comprises a second scanning mechanism;
the illumination system illuminates only a narrow band, or set of parallel bands, on the image source and on the microlens array at any particular instant in time; and
the second scanning mechanism repeatedly scans the illumination band or bands across the image field in synchronization with the first scanning mechanism so that each microspot is only illuminated during a very brief time interval during which it is traversed by an illumination band, therby minimizing smearing of the exposure pattern on the printing surface due to the relative motion between the printing surface and the microlens array.

8. The printing system of claim 6 wherein the image source comprises a light-transmitting optical medium, the illumination system illuminates the image source in transmission mode, and the image source elements comprise respective zones on the optical medium having differing optical transmittance characteristics.

9. The printing system of claim 6 wherein the image source comprises a light-reflecting optical medium, the illumination system illuminates the image source in reflection mode, and the image source elements comprise respective zones on the optical medium having differing optical reflectance characteristics.

10. The printing system of claim 9 wherein the image source comprises a digital micromirror device (DMD) and the projection system is telecentric on the object side.

11. The printing system of claim 9, further comprising a beam splitter disposed to merge light from the illumination system into the projection system's light path so that the light, so merged, and the image light reflected from the image source traverse the same optical path between the beam splitter and the image source.

12. The printing system of claim 9 wherein the illumination system comprises an off-axis illumination source adjacent the projection aperture.

13. The printing system of claim 12 wherein the illumination source comprises a fiber optic illuminator.

14. The printing system of claim 12 wherein:
the microlens array defines a first microlens array;
the image source further comprises a digital micromirror device (DMD), and a second microlens array disposed proximate the DMD;
each image source element comprises corresponding first and second microlenses of the second microlens array and a corresponding micromirror of the DMD;
the projection system is telecentric on the object side;
the second microlens array is disposed in the projection system's object plane;
each image source element's corresponding first microlens focuses the illumination source to a corresponding first illumination image point proximate the corresponding micromirror;
each image source element's corresponding micromirror has tilt control and built-in optical power so that, when the micromirror is in its "on" state,
the corresponding first illumination image point is reimaged by the micromirror to a corresponding second illumination image point at the center of the corresponding second microlens's aperture, and
the corresponding first microlens's aperture is imaged by the micromirror to a corresponding aperture image proximate the micromirror;
each image source element's corresponding second illumination image point is reimaged by the projection system onto the corresponding microlens aperture of the first microlens array;
each image source element's corresponding second microlens images the corresponding aperture image onto the projection aperture; and
each image source element's corresponding micromirror is tilted, when in its "off" position, to divert the illumination light intercepted by the corresponding first microlens out of the projection aperture;
wherein the optical power in the DMD micromirror elements and in the second microlens array elements, and the separation distance between the DMD and the second microlens array, are selected to balance the tradeoffs relating to the micromirrors' aperture size requirement and surface form tolerance, the micromirror tilt range and tilt tolerance, energy efficiency, and image cross-talk.

15. The printing system of claim 1 wherein:
the microlens array, the microlens aperture array, and the focal point array of claim 1 respectively define a first microlens array, first microlens aperture array, and first focal point array;
the image source further comprises a second planar array of microlenses having respective apertures defining a second microlens aperture array;
the second microlens aperture array is positioned at the projection system's object plane;
the microlens elements of the second microlens array have respective focal points which are conjugate to the projection aperture and which define a second focal point array; and
each image source element comprises a respective microlens of the second microlens array and a light-modulating element positioned at the respective microlens's focal point.

16. The imaging system of claim 15, further comprising an illumination system and a reflective surface positioned at the second focal point array, and wherein:
the illumination system illuminates the image source in reflection mode;
the light-modulating elements comprise spots of variable reflectivity on the reflective surface at the focal point locations of the second focal point array; and
the second microlens array and projection system are further configured to focus light from the illumination system onto the reflective spots.

17. The printing system of claim 16 wherein the reflective surface comprises a photomask which operates in reflection mode, and the light-modulating elements' reflectivities are varied by translating the photomask across the second focal point array so that different portions of the photomask with different optical reflectance characteristics are brought into position at the focal points of the second focal point array as the printing surface is scanned.

18. The printing system of claim 1 wherein the projection system is double-telecentric.

19. The printing system of claim 18, wherein the projection system comprises a first collimating lens element that images the projection aperture to infinity on the object side of the projection system, thereby making the system telecentric on the object side, and a second collimating lens element that images the projection aperture to infinity on the projection system's image side, thereby making the system telecentric on the image side.

20. The printing system of claim 18 wherein the projection system comprises:
a collimating mirror having first and second off-axis portions; and
a reflector in the projection aperture; wherein
the first off-axis portion of the collimating mirror images the projection aperture to infinity on the object side of the projection system, thereby making the system telecentric on the object side;
the first off-axis portion reflects light from the object plane toward the projection aperture;
the reflector in the projection aperture reflects the light from the first off-axis portion back onto the collimating mirror on its second off-axis portion;
the second off-axis portion reflects the light from the projection aperture onto the image plane; and
the second off-axis portion images the projection aperture to infinity on the image side, thereby making the system telecentric on the image side.

21. The printing system of claim 1, further comprising an optical detector and positional feedback control mechanism, wherein:
the microlens array and projection system not only focus light from the image source onto the printing surface, but also collect a reflected beam comprising optical energy reflected from the printing surface and project it onto the optical detector, thereby producing a detector signal which provides information on the positional relationship between microlens array and the printing surface; and
the positional information is used by the feedback control mechanism to accurately control the positional relationship.

22. The printing system of claim 21, further comprising a beam splitter disposed to separate the reflected beam from the projection system's light path, wherein the light projected onto the printing surface and the reflected light traverse the same optical path between the beam splitter and the printing surface.

23. The printing system of claim 22 wherein the printing surface is illuminated by two wavelengths or narrow spectral ranges of wavelengths, a first wavelength which exposes the photosensitive material, and a second wavelength which is sensed by the detector to provide positional information.

24. The printing system of claim 23 wherein the projection system is double-telecentric.

25. The printing system of claim 24 wherein the projection system comprises:
a collimating mirror having first and second off-axis portions; and
a reflector in the projection aperture; wherein
the first off-axis portion of the collimating mirror images the projection aperture to infinity on the object side of the projection system, thereby making the system telecentric on the object side;
the first off-axis portion reflects light at the first wavelength from the object plane toward the projection aperture;
the reflector in the projection aperture reflects the light from the first off-axis portion back onto the collimating mirror on its second off-axis portion;
the second off-axis portion reflects the light from the projection aperture onto the image plane; and
the second off-axis portion images the projection aperture to infinity on the image side, thereby making the system telecentric on the image side.

26. The printing system of claim 25 wherein:
the collimating mirror further comprises a third off-axis portion;
the aperture reflector further comprises a first optical coating which is deposited on a transparent wedge substrate, and which exhibits high reflectivity at the first wavelength, but which is transparent at the second wavelength;
the beam splitter comprises a second optical coating which is deposited on the wedge, on the surface opposite that of the first coating;
the second coating is partially reflective at the second wavelength;
illumination energy at the second wavelength is projected from a light source through both coatings, toward the second off-axis portion of the collimating mirror, so that both wavelengths traverse the same optical path between the wedge and the printing surface;
the beam reflected back from the printing surface at the second wavelength is partially reflected by the second coating toward the third off-axis mirror portion, which is spatially separated from the first off-axis portion due to the wedge angle between the two coatings; and
the third off-axis mirror portion then reflects the beam onto the detector.

27. The printing system of claim 21 wherein:
the printing surface further comprises positioning alignment marks that are detected by the positional feedback control mechanism and are used to determine a component of the positional relationship defined by the microlens array's and printing surface's lateral positional relationship parallel to the microlens array; and
the positional information is used to accurately control the lateral positional relationship and to synchronize the scanning mechanism with the image source.

28. The printing system of claim 27 wherein the alignment marks and focal point array comprise periodic patterns, with the periodicity of the alignment marks differing from that of the focal point array so that the reflected energy from the alignment marks forms a Moiré pattern in the detector signal which provides an accurate and precise measure of the lateral positional relationship between the microlens array and the printing surface.

29. The printing system of claim 21 wherein the projection aperture greatly attenuates out-of-focus light from the microlenses so that the detector signal comprises a focus signal that provides an accurate and precise measure of the microlens array's focus height relative to the printing surface, and wherein the focus signal is used by the positional feedback control mechanism to accurately control the focus height.

30. The printing system of claim 26 wherein the focus height is detected at one or more positions on the printing surface, and wherein the focus height at each position is detected by comparing the reflected energy signals from two or more microlenses which are focused on proximate points on a flat area on the printing surface, but which have different focal lengths so that the differential detector signal from the microlenses provides a sensitive measure of focus height.

31. The printing system of claim 29 wherein the focus height is detected at one or more positions on the printing surface, and wherein the focus height at each position is detected by comparing the reflected energy signals from two or more microlenses which have the same focal length, but which are focused on proximate points straddling a step or steps on the printing surface so that the differential detector signal from the microlenses provides a sensitive measure of focus height.

32. The printing system of claim 31 wherein:

the focus steps are recessed wells in the printing surface, and the printing surface comprises a top surface outside of the focus wells and a bottom surface at the bottom of the focus wells;

the photosensitive material is disposed on the top surface;

the printing surface is illuminated by two wavelengths or narrow spectral ranges of wavelengths, a first wavelength which exposes the photosensitive material, and a second wavelength which is sensed by the detector to provide the focus signal; and the focus signal is obtained from microlens elements that are used for the dual purposes of printing and focus sensing, but wherein their focal length at the second wavelength is longer than at the first wavelength due to chromatic dispersion, whereby the microlens array can be positioned to focus the first wavelength onto the top surface while simultaneously focusing the second wavelength onto a focal plane between the top and bottom surfaces to achieve good focus signal resolution.

33. The printing system of claim 1, further comprising a two-axis positioning transducer that continuously adjusts the projection aperture's lateral position parallel to the projection aperture plane to correct for small errors in the microlens array's and printing surface's lateral positional relationship parallel to the microlens array.

34. The printing system of claim 1, further comprising micropositioning transducers disposed around the microlens array's periphery outside of its clear aperture, wherein the transducers apply a controlled force distribution to the array to correct focus and tilt errors and compensate for warp or shape mismatch between the printing surface and microlens array.

35. The printing system of claim 34, further comprising micropositioning transducers which control the microlens array's lateral translational and rotational positions parallel to the microlens array.

* * * * *

UNITED STATES PATENT AND TRADEMARK OFFICE
CERTIFICATE OF CORRECTION

PATENT NO.    : 6,133,986
ISSUED        : October 17, 2000
INVENTOR(S)   : Kenneth C. Johnson It is certified that errors appear in the above-identified patent and that said Letters Patent is hereby corrected as shown below:

Col. 5, line 35, change "dr" to -- $d_r$ --

Col. 10, line 27, in Eq 26 change both occurrences of "sin $c$" to -- sinc --

Col. 11, lines 18-19, change "sin $c^2$" to -- sinc$^2$ --

Col. 12, line 47, in Eq 35 change "=" to -- $\cong$ --

Col. 16, line 14, change "$A'$" to -- $A''$ --

Col. 22, line 33, in Eq 42 change "sin $c^2$" to -- sinc$^2$ --

Col. 26, line 34, in Eq A5 the expression "$|y'| > 2NA_m$" should not be obscured by "Eq A5".

Col. 26, line 52, in Eq A8 change "$|A[x,y]|$" to -- $|A[x,y]|^2$ --

Signed and Sealed this

Twenty-second Day of May, 2001

*Attest:*

NICHOLAS P. GODICI

*Attesting Officer*    Acting Director of the United States Patent and Trademark Office